United States Patent
Yang et al.

(10) Patent No.: US 9,356,182 B2
(45) Date of Patent: May 31, 2016

(54) SOLAR CELL AND METHOD OF MANUFACTURING THE SAME

(71) Applicant: LG ELECTRONICS INC., Seoul (KR)

(72) Inventors: Youngsung Yang, Seoul (KR); Junghoon Choi, Seoul (KR); Hyunjung Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/555,155

(22) Filed: Nov. 26, 2014

(65) Prior Publication Data

US 2015/0144183 A1 May 28, 2015

(30) Foreign Application Priority Data

Nov. 28, 2013 (KR) .................. 10-2013-0146519

(51) Int. Cl.
| | |
|---|---|
| *H01L 29/66* | (2006.01) |
| *H01L 31/18* | (2006.01) |
| *H01L 31/0224* | (2006.01) |
| *H01L 21/266* | (2006.01) |
| *H01L 31/0747* | (2012.01) |
| *H01L 31/0352* | (2006.01) |

(52) U.S. Cl.
CPC .......... *H01L 31/1804* (2013.01); *H01L 21/266* (2013.01); *H01L 31/022441* (2013.01); *H01L 31/03529* (2013.01); *H01L 31/0747* (2013.01); *H01L 31/1864* (2013.01); *Y02P 70/521* (2015.11)

(58) Field of Classification Search
CPC .............. H01L 31/1804; H01L 21/266; H01L 31/022441; H01L 31/03529; H01L 31/0747; H01L 31/1864; Y02P 70/521
See application file for complete search history.

(56) References Cited

U.S. PATENT DOCUMENTS

| | | | |
|---|---|---|---|
| 2003/0057419 A1* | 3/2003 | Murakami | G02F 1/13454 257/72 |
| 2009/0227097 A1 | 9/2009 | Bateman et al. | |
| 2010/0258182 A1 | 10/2010 | Akimoto | |
| 2011/0186111 A1* | 8/2011 | Straboni | H01L 31/0465 136/249 |
| 2011/0306164 A1 | 12/2011 | Kim et al. | |
| 2011/0315937 A1 | 12/2011 | Aoyagi et al. | |
| 2012/0171804 A1* | 7/2012 | Moslehi | B23K 26/0656 438/71 |
| 2012/0255603 A1 | 10/2012 | Yu et al. | |
| 2013/0298975 A1 | 11/2013 | Yang et al. | |
| 2013/0298989 A1* | 11/2013 | Tomizawa | H01L 31/03762 136/258 |
| 2014/0174516 A1 | 6/2014 | Choi et al. | |
| 2015/0075595 A1 | 3/2015 | Gall | |

FOREIGN PATENT DOCUMENTS

| | | |
|---|---|---|
| EP | 1835548 A1 | 9/2007 |
| FR | 2988908 A1 | 10/2013 |

(Continued)

*Primary Examiner* — Fernando L Toledo
*Assistant Examiner* — Neil Prasad
(74) *Attorney, Agent, or Firm* — Birch, Stewart, Kolasch & Birch, LLP

(57) ABSTRACT

A solar cell is discussed. The solar cell according to an embodiment includes a semiconductor substrate, a first conductive type region and a second conductive type region disposed on the same side of the semiconductor substrate, wherein at least one of the first and second conductive type regions includes a main region and a boundary region disposed at a peripheral portion of the main region, and the boundary region has at least one of a varying doping concentration and a varying doping depth.

20 Claims, 14 Drawing Sheets

(56) References Cited

FOREIGN PATENT DOCUMENTS

| JP | 2013-219080 A | 10/2013 |
| KR | 10-2011-0135609 A | 12/2011 |
| KR | 10-2013-0126302 A | 11/2013 |

\* cited by examiner

SOLAR CELL AND METHOD OF MANUFACTURING THE SAME

CROSS-REFERENCE TO RELATED APPLICATION

This application claims the priority benefit of Korean Patent Application No. 10-2013-0146519, filed on Nov. 28, 2013 in the Korean Intellectual Property Office, the disclosure of which is incorporated herein by reference.

BACKGROUND OF THE INVENTION

1. Field of the Invention

Embodiments of the invention relate to a solar cell and a method of manufacturing the same, and more particularly to a back contact solar cell and a method of manufacturing the same.

2. Description of the Related Art

Recently, as existing energy resources such as petroleum and coal are running out, interest in alternative energy sources is increasing. In particular, solar cells, which directly convert solar energy into electric energy, are receiving much attention as a next-generation alternative energy source.

These solar cells may be manufactured by forming various layers and electrodes according to a design. In this regard, efficiency of a solar cell may be determined according to the design of various layers and electrodes. For widespread use of the solar cells, low efficiency thereof needs to be overcome. Therefore, there is a need to develop a method of manufacturing a solar cell having maximized efficiency through the design of various layers and electrodes.

SUMMARY OF THE INVENTION

Embodiments of the invention provide a solar cell having enhanced efficiency and a method of manufacturing the same.

In one embodiment of the invention, a solar cell includes a semiconductor substrate, and a first conductive type region and a second conductive type region disposed on the same side of the semiconductor substrate, wherein at least one of the first and second conductive type regions includes a main region and a boundary region disposed at a peripheral portion of the main region, and wherein the boundary region has at least one of a varying doping concentration and a varying doping depth.

The first conductive type region may include a first main region and a first boundary region disposed at a peripheral portion of the first main region, and the first boundary region may have at least one of a first varying doping concentration and a first varying doping depth. The second conductive type region may include a second main region and a second boundary region disposed at a peripheral portion of the second main region, and the second boundary may have at least one of a second varying doping concentration and a second varying doping depth. The first boundary region may have a different width than the second boundary region.

The first conductive type region may be of a p-type, the second conductive type region may be of an n-type, and the first boundary region may have a larger width than the second boundary region.

The semiconductor substrate may include a base region, and the base region may be of an n-type.

The width of the first boundary region may be twice or more of the width of the second boundary region.

The width of the first boundary region may be twice to four times the width of the second boundary region.

The first conductive type region may include boron (B) and is of a p-type, and the second conductive type region may include phosphorus (P) and is of an n-type.

At least one of a doping concentration and a doping depth of the boundary region may gradually decrease in going away from the main region.

A barrier region or a base region may be disposed between the first and second conductive type regions.

The first conductive type region, the second conductive type region and the boundary region may be coplanar.

A distance between the first and second conductive type regions may be 1 µm to 100 µm.

In another embodiment of the invention, a method of manufacturing a solar cell includes forming first and second conductive type regions on the same side of a semiconductor substrate. At least one of the first and second conductive type regions includes a main region and a boundary region disposed at a peripheral portion of the main region, and the boundary region at least one of a varying doping concentration and a varying doping depth.

The first conductive type region may include a first main region and a first boundary region disposed at a peripheral portion of the first main region, and the first boundary region having at least one of a first varying doping concentration and a first varying doping depth. The second conductive type region may include a second main region and a second boundary region disposed at a peripheral portion of the second main region, and the second boundary region having at least one of a second varying doping concentration and a second varying doping depth. The first boundary region may have a different width than the second boundary region.

The first and second main regions may be formed by ion implantation, and the first and second boundary regions may be formed through diffusion by activated heat treatment.

The activated heat treatment of the first main region and the activated heat treatment of the second main region may be performed together using the same manufacturing process.

The first and second main regions may be respectively formed through ion implantation of first and second conductive type impurities using a mask member or a barrier member as a mask.

The forming of the first and second conductive type regions may include forming a semiconductor layer at a surface of the semiconductor substrate, forming the first main region by doping the semiconductor layer with a first conductive type impurity using a mask having a first opening exposing a region corresponding to the first main region, forming the second main region by doping the semiconductor layer with a second conductive type impurity using a mask having a second opening exposing a region corresponding to the second main region, and forming the first and second boundary regions in an undoped region disposed between the first and second main regions by heat-treating the first and second main regions.

A barrier region may be disposed between the first and second conductive type regions, and the barrier region may have a smaller area than the undoped region.

The method may further include, between the forming of the semiconductor layer and the forming of the first main region, forming a barrier member on the semiconductor layer, the barrier member corresponding to a boundary portion between the first and second conductive type regions.

The method may further include, between the forming of the semiconductor layer and the forming of the first main region, forming an amorphous region in the semiconductor layer by ion-implanting a preamorphized element into a boundary portion between the first and second conductive type regions of the semiconductor layer.

In the embodiments of the invention, a conductive type region includes a boundary region and thus the area of the conductive type region participating in photoelectric conversion may be maximized. In this regard, the size of the first conductive type region functioning as an emitter region may further be increased by forming a width of a boundary region of the first conductive type region having a conductive type opposite that of the base region to be greater than a width of a boundary region of the second conductive type region having the same conductive type as that of the base region. In this regard, when the first conductive type region is of a p-type and the second conductive type region is of an n-type, the widths of the boundary regions of the first and second conductive type regions may be easily adjusted using properties of first and second conductive type impurities without further performing separate manufacturing processes or further using separate devices. As such, the areas of the first and second conductive type regions are maximized and, in particular, the size of the first conductive type region is further increased and, accordingly, efficiency of the solar cell may be enhanced.

The first and second conductive type regions may be easily formed by ion implantation and the widths thereof may also be easily adjusted. According to the manufacturing method according to the embodiment of the invention, a solar cell having an improved structure may be manufactured using simplified and easy manufacturing processes.

BRIEF DESCRIPTION OF THE DRAWINGS

Details of the embodiments of the invention will be more clearly understood from the following detailed description taken in conjunction with the accompanying drawings, in which.

DETAILED DESCRIPTION OF THE EMBODIMENTS

Figure 1:
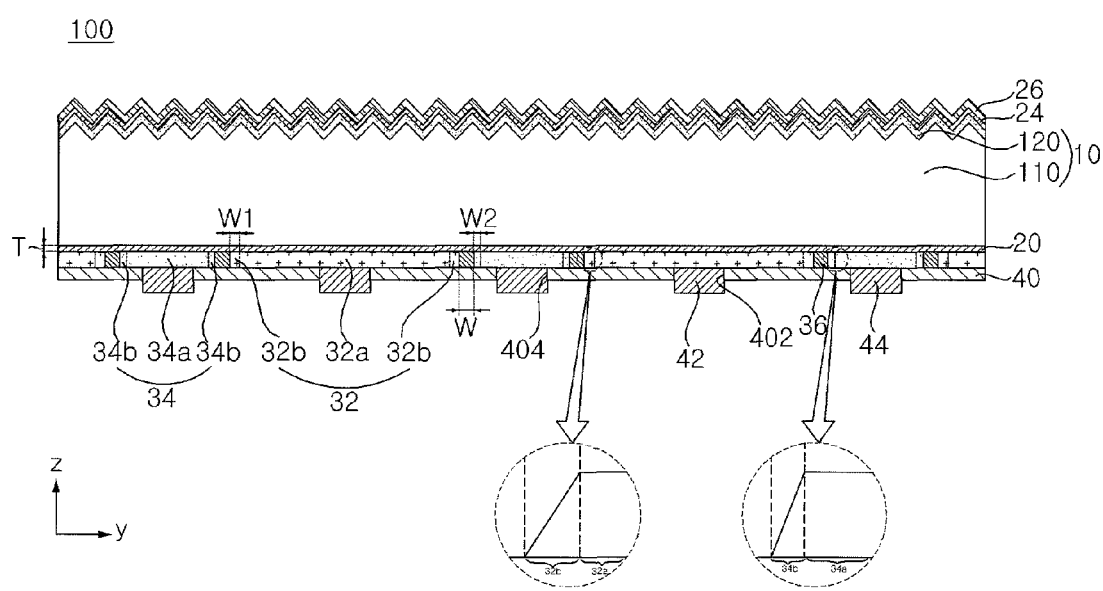
FIG. 1 is a sectional view of a solar cell according to an embodiment of the invention.

Reference will now be made in detail to embodiments of the invention, examples of which are illustrated in the accompanying drawings. However, the invention may be embodied in many different forms and should not be construed as limited to the embodiments set forth herein.

Only elements constituting features of the embodiments of the invention are illustrated in the accompanying drawings and other elements that will not be described herein are omitted from the drawings, for clarity of description. Like reference numerals refer to like elements throughout. In the drawings, the thicknesses, areas, etc., of constituent elements may be exaggerated or reduced for clarity and convenience of illustration. The embodiments of the invention are not limited to the illustrated thicknesses, areas, etc.

It will be further understood that, throughout this specification, when one element is referred to as "comprising" another element, the term "comprising" specifies the presence of another element but does not preclude the presence of other additional elements, unless the context clearly indicates otherwise. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Hereinafter, a solar cell according to an embodiment of the invention and a method of manufacturing the same will be described in detail with reference to the accompanying drawings.

Figure 2:
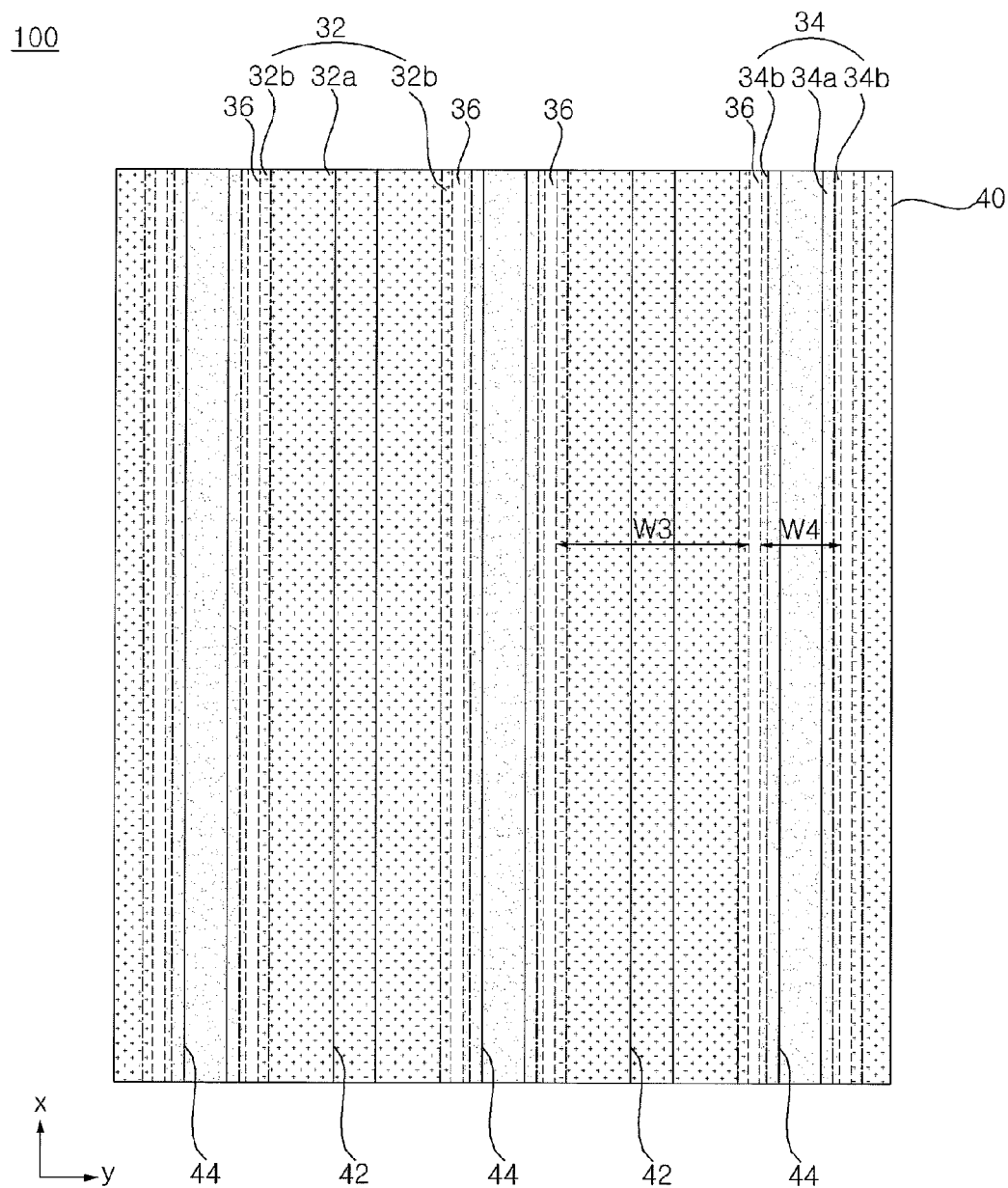
FIG. 2 is a partial rear plan view of the solar cell illustrated in FIG. 1.

FIG. 1 is a sectional view of a solar cell 100 according to an embodiment of the invention. FIG. 2 is a partial rear plan view of the solar cell 100 of FIG. 1.

Referring to FIGS. 1 and 2, the solar cell 100 according to the embodiment of the invention includes a semiconductor substrate 10 including a base region 110, a tunneling layer 20 disposed on a surface (e.g., a back surface) of the semiconductor substrate 10, conductive type regions 32 and 34 disposed on the tunneling layer 20, and electrodes 42 and 44 respectively connected to the conductive type regions 32 and 34. In addition, the solar cell 100 may further include a passivation film 24, an anti-reflective film 26, and an insulating layer 40 (or a back surface passivation film). This will be described below in more detail.

The semiconductor substrate 10 may include the base region 110 including a second conductive type dopant at a relatively low doping concentration. In the embodiment of the invention, the base region 110 may include crystalline (mono-crystalline or polycrystalline) silicon including a second conductive type dopant. For example, the base region 110 may be a mono-crystalline silicon substrate (e.g., a mono-crystalline silicon wafer) including a second conductive type dopant. The second conductive type dopant may be of an n-type or a p-type. The n-type dopant may be a Group V element such as phosphorus (P), arsenic (As), bismuth (Bi), antimony (Sb), or the like, and the p-type dopant may be a Group III element such as boron (B), aluminum (Al), gallium (Ga), indium (In), or the like. For example, when the base region 110 is of an n-type, a first conductive type region 32 of a p-type to form a junction (e.g., a pn junction with the tunneling layer 20 disposed therebetween) that forms carriers by photoelectric conversion with the base region 110 has a wide area and thus a photoelectric conversion area may be increased. In addition, in this instance, the first conductive type region 32 having a wide area effectively collects holes having a relatively slow movement rate and thus may further contribute to improvement in the photoelectric conversion efficiency. However, the embodiment of the invention is not limited to the above examples.

In addition, the semiconductor substrate 10 may include a front surface field region 120 at a front surface thereof. The front surface field region 120 may have the same conductive type as that of the base region 110 and a higher doping concentration than the base region 110.

In the embodiment of the invention, the front surface field region 120 is a doping region formed by doping the semiconductor substrate 10 with a second conductive type dopant at a relatively high doping concentration. Accordingly, the front surface field region 120 constitutes the semiconductor substrate 10, including a crystalline (mono-crystalline or polycrystalline) semiconductor of a second conductive type. For example, the front surface field region 120 may be formed as a portion of a mono-crystalline semiconductor substrate (e.g., a mono-crystalline silicon wafer substrate) of a second conductive type. However, the embodiment of the invention is not limited to the above examples. Thus, the front surface field region 120 may be formed by doping a separate semiconductor layer from the semiconductor substrate 10 (e.g., an amorphous semiconductor layer, a micro-crystalline semiconductor layer, or a polycrystalline semiconductor layer) with a second conductive type dopant. In another embodiment, the front surface field region 120 may be a field region that acts similarly to a region formed through doping by fixed charges of a layer formed adjacent to the semiconductor substrate 10 (e.g., the passivation film 24 and/or the anti-reflective film 26). The front surface field region 120 having various structures may be formed using various other methods.

In the embodiment of the invention, the front surface of the semiconductor substrate 10 may be textured to have an uneven portion in the form of a pyramid, or the like. Through the texturing process, the uneven portion is formed at the front surface of the semiconductor substrate 10 and thus reflectance of light incident upon the front surface of the semiconductor substrate 10 may be reduced. Accordingly, the amount of light reaching a pn junction formed by the base region 110 and the first conductive type region 32 may be increased and, consequently, light loss may be minimized.

Meanwhile, the back surface of the semiconductor substrate 10 may be a relatively smooth and even surface formed by mirror polishing or the like and having a lower surface roughness than the front surface of the semiconductor substrate 10. As in the embodiment of the invention, when the first and second conductive type regions 32 and 34 are formed together on the back surface of the semiconductor substrate 10, characteristics of the solar cells 100 may largely vary according to characteristics of the back surface of the semiconductor substrate 10. Since an uneven portion by texturing is not formed at the back surface of the semiconductor substrate 10, passivation characteristics may be enhanced and, accordingly, the characteristics of the solar cells 100 may be enhanced. However, the embodiment of the invention is not limited to the above examples. In some instances, an uneven portion may be formed at the back surface of the semiconductor substrate 10 by texturing. In addition, various modifications are possible.

The tunneling layer 20 is formed on the back surface of the semiconductor substrate 10. Interface properties of the back surface of the semiconductor substrate 10 may be enhanced by the tunneling layer 20 and the tunneling layer 20 enables carriers generated by photoelectric conversion to be smoothly transferred by tunneling effects. The tunneling layer 20 may include various materials enabling carriers to tunnel therethrough, e.g., an oxide, a nitride, a semiconductor, a conductive polymer, or the like. For example, the tunneling layer 20 may include silicon oxide, silicon nitride, silicon oxynitride, intrinsic amorphous silicon, intrinsic polycrystalline silicon, or the like. In this regard, the tunneling layer 20 may be formed over the entire back surface of the semiconductor substrate 10. Accordingly, the tunneling layer 20 may completely passivate the back surface of the semiconductor substrate 10 and be easily formed without separate patterning.

To have sufficient tunneling effects, the tunneling layer 20 may have a thickness T1 that is less than that of the insulating film 40. For example, the thickness T1 of the tunneling layer 20 may be 10 nm or less, for example, 0.5 nm to 10 nm (more particularly, 0.5 nm to 5 nm, e.g., 1 nm to 4 nm). When the thickness T1 of the tunneling layer 20 exceeds 10 nm, tunneling does not smoothly occur and thus the solar cells 150 may not operate. On the other hand, when the thickness T1 of the tunneling layer 20 is less than 0.5 nm, it may be difficult to form the tunneling layer 20 with the desired quality. To further improve tunneling effects, the thickness T1 of the tunneling layer 20 may be 0.5 nm to 5 nm (more particularly, 1 nm to 4 nm). However, the embodiment of the invention is not limited to the above examples and the thickness T1 of the tunneling layer 20 may have various values.

The conductive type regions 32 and 34 may be disposed on the tunneling layer 20. More particularly, the conductive type regions 32 and 34 may include the first conductive type region 32 including a first conductive type dopant thus having a first conductive type and the second conductive type region 34 including a second conductive type dopant thus having a second conductive type. In addition, a barrier region 36 may be disposed between the first and second conductive type regions 32 and 34.

The first conductive type region 32 forms a pn junction (or pn tunnel junction) with the base region 110 and the tunneling layer 20 disposed therebetween and thus constitutes an emitter region that generates carriers by photoelectric conversion.

In this regard, the first conductive type region 32 may include a semiconductor (e.g., silicon) including a first conductive type dopant opposite the base region 110. In the embodiment of the invention, the first conductive type region 32 is formed separately from the semiconductor substrate 10, on the semiconductor substrate 10 (more particularly, on the tunneling layer 20) and is formed as a semiconductor layer doped with a first conductive type dopant. Thus, the first conductive type region 32 may be formed as a semiconductor layer having a different crystal structure than the semiconductor substrate 10 so as to be easily formed on the semiconductor substrate 10. For example, the first conductive type region 32 may be formed by doping an amorphous semiconductor, micro-crystalline semiconductor or polycrystalline semiconductor (e.g., amorphous silicon, micro-crystalline silicon, or polycrystalline silicon) that may be easily manufactured by various methods such as deposition and the like, with a first conductive type dopant. The first conductive type dopant may be included in the formed semiconductor layer by various doping methods.

In this regard, the first conductive type dopant may be any dopant having a conductive type opposite the base region 110. That is, when the first conductive type dopant is of a p-type, the first conductive type dopant may be a Group III element such as B, Al, Ga, In, or the like. When the first conductive type dopant is of an n-type, the first conductive type dopant may be a Group V element such as P, As, Bi, Sb, or the like.

The second conductive type region 34 forms a back surface field and thus forms a back surface field region that prevents loss of carriers by recombination at a surface (more particularly, the back surface) of the semiconductor substrate 10.

In this regard, the second conductive type region 34 may include a semiconductor (e.g., silicon) including the same second conductive type dopant as that of the base region 110. In the embodiment of the invention, the second conductive type region 34 is formed separately from the semiconductor substrate 10, on the semiconductor substrate 10 (more particularly, on the tunneling layer 20) and is formed as a semiconductor layer doped with a second conductive type dopant. Thus, the second conductive type region 34 may be formed as a semiconductor layer having a different crystal structure than the semiconductor substrate 10 so as to be easily formed on the semiconductor substrate 10. For example, the second conductive type region 34 may be formed by doping an amorphous semiconductor, micro-crystalline semiconductor or polycrystalline semiconductor (e.g., amorphous silicon, micro-crystalline silicon, or polycrystalline silicon) that may be easily manufactured by various methods such as deposition and the like, with a second conductive type dopant. The second conductive type dopant may be included in the formed semiconductor layer by various doping methods.

In this regard, the second conductive type dopant may be any dopant having the same conductive type as that of the base region 110. That is, when the second conductive type dopant is of an n-type, the second conductive type dopant may be a Group V element such as P, As, Bi, Sb, or the like. When the second conductive type dopant is of a p-type, the second conductive type dopant may be a Group III element such as B, Al, Ga, In, or the like.

In addition, the barrier region 36 is disposed between the first and second conductive type regions 32 and 34 to separate the first conductive type region 32 from the second conductive type region 34. When the first and second conductive type regions 32 and 34 contact each other, shunting occurs and, accordingly, performance of the solar cells 150 may be deteriorated. Thus, in the embodiment of the invention, the barrier region 36 may be disposed between the first and second conductive type regions 32 and 34 to prevent unnecessary occurrence of shunting.

The barrier region 36 may include various materials enabling the first and second conductive type regions 32 and 34 to be substantially insulated from each other. That is, the barrier region 36 may be formed of an undoped insulating material (e.g., an oxide or a nitride). In another embodiment, the barrier region 36 may be formed as an intrinsic region including an intrinsic semiconductor. In this regard, the first and second conductive type regions 32 and 34 and the barrier region 36 are formed on the same plane, have substantially the same thickness, are formed of the same semiconductor (e.g., amorphous silicon, micro-crystalline silicon, or polycrystalline silicon), and may not include a dopant. For example, a semiconductor layer including a semiconductor material may be formed, a region of the semiconductor layer is doped with a first conductive type dopant to form the first conductive type region 32, another region thereof is doped with a second conductive type dopant to form the second conductive type region 34, and the barrier region 36 may be formed in a region of the semiconductor layer in which the first and second conductive type regions 32 and 34 are not formed. According to the embodiment of the invention, a manufacturing method of the first and second conductive type regions 32 and 34 and the barrier region 36 may be simplified.

In an embodiment, the barrier region 36 may have a width (or a distance between the first and second conductive type regions 32 and 34) of 1 μm to 100 μm. When the width of the barrier region 36 is less than 1 μm, it may be difficult to prepare the barrier regions 36 and shunting prevention effects may be insufficient. On the other hand, when the width of the barrier region 36 exceeds 100 μm, the area of the barrier region 36 increases and thus the areas of the first and second conductive type regions 32 and 34 decrease and, accordingly, efficiency of the solar cell 100 may be reduced. However, the embodiment of the invention is not limited to the above examples, and the width W of the barrier region 36 may have various values.

Further, the embodiment of the invention is not limited to the above examples. That is, when the barrier region 36 is formed separately from the first and second conductive type regions 32 and 34, the barrier region 36 may have a different thickness than that of the first and second conductive type regions 32 and 34. For example, to more effectively prevent short circuit between the first and second conductive type regions 32 and 34, the thickness of the barrier region 36 may be greater than that of the first and second conductive type regions 32 and 34. In another embodiment, to reduce raw material costs for forming the barrier region 36, the thickness of the barrier region 36 may be less than that of the first and second conductive type regions 32 and 34. In addition, various modifications are possible. In addition, a basic constituent material of the barrier region 36 may be different than those of the first and second conductive type regions 32 and 34. In another embodiment, the barrier region 36 may be formed as an empty space (e.g., a trench) disposed between the first and second conductive type regions 32 and 34.

In addition, the barrier region 36 may be formed so as to separate only portions of the first and second conductive type regions 32 and 34 at an interface therebetween from each other. Thus, other portions of the first and second conductive type regions 32 and 34 at the interface therebetween may contact each other. In addition, the barrier region 36 may not be necessarily formed, and the first and second conductive type regions 32 and 34 (in particular, a first boundary region 32b of the first conductive type region 32 and a second boundary region 34b of the second conductive type region 34) may entirely contact each other. In addition, various modifications are possible.

In the embodiment of the invention, the second conductive type region 34 having the same conductive type as that of the base region 110 may have a narrower area than the first conductive type region 32 having a different conductive type than that of the base region 110. Thus, a pn junction formed between the base region 110 and the first conductive type region 32 via the tunneling layer 20 may have a wider area. In this regard, when the base region 110 and the second conductive type region 34 are n-type conductive and the first conductive type region 32 is p-type conductive, the first conductive type region 32 having a wide area may effectively collect holes having a relatively slow movement rate. The planar structure of the first and second conductive type regions 32 and 34 and the barrier region 36 will be described below in further detail with reference to FIG. 2.

Hereinafter, the first and second conductive type regions 32 and 34 according to the embodiment of the invention will be described in more detail. In enlarged circles of FIG. 1, changes in doping concentrations of portions corresponding to the first and second conductive type regions 32 and 34 are schematically illustrated.

The first conductive type region 32 according to the embodiment of the invention includes a first main region 32a having a substantially uniform doping concentration and first boundary regions 32b disposed at opposite edges of the first main region 32a and having a varying doping concentration. For example, the first boundary regions 32b may be formed along edges of the first main region 32a.

The first main regions 32a are regions having a substantially uniform doping concentration formed through doping with a first conductive type impurity via a mask having openings with certain patterns. The first boundary regions 32b are regions formed through diffusion of a first conductive type impurity by performing subsequent heat-treatment and the like of regions having a small doping amount of the first conductive type impurity or undoped therewith, to correspond to boundaries of the openings of the mask or portions in which the openings are not formed.

Assuming that a doping concentration of the first main region 32a (e.g., an average doping concentration of the first main regions 32a) is denoted as a first concentration, the first boundary regions 32b refers to regions having a varying doping concentration from the first concentration to approximately 0. For example, the first boundary regions 32b may have a gradually decreasing doping concentration away from the first main region 32a. In this regard, the doping concentration of the first boundary regions 32b may vary, for example, linearly (i.e., constant slope). However, the embodiment of the invention is not limited to the above example and the doping concentration may be variously changed (e.g., non-linearly).

In this regard, starting and end points of the first boundary region 32b may be based on portions determined to have a doping concentration that varies with reference to a doping profile or the like. For example, a first point directing from the first main region 32a to the outside and having a doping concentration decreased by 10% or more than the first concentration may be denoted as the starting point of the first boundary region 32b, and a first point directing from the first main region 32a to the outside and having a doping concentration of approximately 0 may be denoted as the end point of the first boundary region 32b. However, the embodiment of the invention is not limited to the above examples, and basis for determination of the first boundary regions 32b may be variously changed.

The second conductive type region 34 according to the embodiment of the invention includes a second main region 34a having a substantially uniform doping concentration and second boundary regions 34b disposed at opposite edges of the second main region 34a and having a varying doping concentration. For example, the second boundary regions 34b may be formed along edges of the second main region 34a.

The second main regions 34a are regions having a substantially uniform doping concentration formed through doping with a second conductive type impurity via a mask having openings with certain patterns. The second boundary regions 34b are regions formed through diffusion of a second conductive type impurity by performing subsequent heat-treatment and the like of regions having a small doping amount of the second conductive type impurity or undoped therewith, to correspond to boundaries of the openings of the mask or portions in which the openings are not formed.

Assuming that a doping concentration of the second main region 34a (e.g., an average doping concentration of the second main regions 34a) is denoted as a second concentration, the second boundary regions 34b are regions having a varying doping concentration from the second concentration to approximately 0. For example, the second boundary regions 34b may have a gradually decreasing doping concentration away from the second main region 34a. In this regard, the doping concentration of the second boundary regions 34b may vary, for example, linearly (i.e., constant slope). However, the embodiment of the invention is not limited to the above example and the doping concentration may be variously changed (e.g., non-linearly).

In this regard, starting and end points of the second boundary region 34b may be based on portions determined to have a doping concentration that varies with reference to a doping profile or the like. For example, a first point directing from the second main region 34a to the outside and having a doping concentration decreased by 10% or more than the second concentration may be denoted as the starting point of the second boundary region 34b, and a first point directing from the second main region 34a to the outside and having a doping concentration of approximately 0 may be denoted as the end point of the second boundary region 34b. However, the embodiment of the invention is not limited to the above examples, and basis for determination of the second boundary regions 34b may be variously changed.

In this regard, the first and second boundary regions 32b and 34b are formed in regions except for regions defined by openings of a mask. Thus, when respectively including the first and second boundary regions 32b and 34b, the first and second conductive types 32 and 34 may have a wider area than each opening of a mask by areas of the first and second boundary regions 32b and 34b. Accordingly, even when there are limitations in increasing the size of openings of a mask, the first and second conductive type regions 32 and 34 having a wider area than conventional conductive type regions may be formed by forming the first and second boundary regions 32b and 34b. Thus, a distance between the first and second conductive type regions 32 and 34 (more particularly, the size of the barrier region 36 disposed between the first and second boundary regions 32b and 34b) may be further reduced. The barrier region 36 serves to prevent occurrence of unnecessary shunting and the like of the first and second conductive type regions 32 and 34, but, when the barrier region 36 has a wide area, the area of a region participating in photoelectric conversion may decrease. Thus, the barrier region 36 may be disposed between the first and second conductive type regions 32 and 34 so as to have a width as small as possible. As in the embodiment of the invention, when the first and second boundary regions 32b and 34b are respectively formed at outer sides (or peripheral portions) of the first and second main regions 32a and 32b, the barrier region 36 may have a decreased width by widths of the first and second boundary regions 32b and 34b and the first and second conductive type regions 32 and 34, which participate in photoelectric conversion, may have an increased area by areas of the first and second boundary regions 32b and 34b, respectively. Accordingly, this may contribute to improvement in the efficiency of the solar cell 100.

The first and second boundary regions 32b and 34b may be formed through doping with first and second conductive type impurities, respectively, by ion implantation in a doping process for forming the first and second conductive type regions 32 and 34. In thermal diffusion or diffusion using a separately formed impurity layer, a first or second conductive type impurity is infinitely (or continually) supplied during heat treatment and thus lateral diffusion vigorously occurs and, accordingly, it may be difficult to form the first and second boundary regions 32b and 34b or to control the widths of the first and second boundary regions 32b and 34b. By contrast, ion implantation is a process in which a first or second conductive type impurity is ion-implanted and then the ion-implanted impurity is diffused by an activated heat-treatment process. Thus, when ion implantation is used, it is easy to form the first and second boundary regions 32b and 34b by controlling diffusion of the first or second conductive type impurity and to control the widths thereof. Therefore, the first and second boundary regions 32b and 34b according to the embodiment of the invention may be formed by ion implantation. This will be described below in more detail with reference to FIGS. 6A to 6I. However, the embodiment of the invention is not limited to the above example, and the first and second boundary regions 32b and 34b may be formed by thermal diffusion, a method using an impurity layer, or the like.

In the embodiment of the invention, a width W1 of the first boundary region 32b may be different from a width W2 of the second boundary region 34b. For example, the width W1 of the first boundary region 32b may be greater than the width W2 of the second boundary region 34b. As such, by forming the width W1 of the first boundary regions 32b of the first conductive type region 32 having a first conductive type opposite that of the base region 110 to be greater than the width W2 of the second boundary regions 34b having the same second conductive type as that of the base region 110, the first conductive type region 32, which acts as an emitter region, may have an increased size. Accordingly, efficiency of the solar cell 100 may be enhanced by maximizing the size of the first conductive type regions 32 constituting a pn junction.

For example, the width W1 of the first boundary regions 32b may be twice or more the width W2 of the second boundary regions 34b. When the width W1 of the first boundary regions 32b is twice or more the width W2 of the second boundary regions 34b, increase effects of the size of the first conductive type regions 32 and decrease effects of the width of the barrier regions 36 may be enhanced. In this regard, an upper limit of the multiple of the width W2 of the second boundary regions 34b to the width W1 of the first boundary regions 32b is not particularly limited. However, there are difficulties in manufacturing processes when forming the width W1 of the first boundary regions 32b so as to exceed 4 times the width W2 of the second boundary regions 34b. Thus, the width W1 of the first boundary regions 32b may be twice to four times the width W2 of the second boundary regions 34b.

In this regard, when the first conductive type regions 32 including the first boundary regions 32b are of a p-type and the second conductive type regions 34 including the second boundary regions 34b are of an n-type, the width of the first boundary regions 32b may be formed to be greater than the width of the second boundary regions 34b using properties of first and second conductive type impurities without further performing separate manufacturing processes or further using separate devices. For example, when boron (B) is used as the first conductive type impurity and phosphorus (P) is used as the second conductive type impurity, B has a small atomic size and a small weight thus having a relatively long diffusion length, while P has a big atomic size and a big weight thus having a relatively short diffusion length. Accordingly, the first boundary regions 32b may have a relatively greater width than the second boundary regions 34b. However, the embodiment of the invention is not limited to the above example. In another embodiment, the width W1 of the first boundary regions 34a may be greater than the width W2 of the second boundary regions 32b by different ways or structures.

In the embodiment of the invention, an instance in which the first and second conductive type regions 32 and 34 are disposed on the back surface of the semiconductor substrate 10 with the tunneling layer 20 disposed therebetween has been described by way of example. However, the embodiment of the invention is not limited to the above example. In another embodiment, the tunneling layer 20 need not be formed and the first and second conductive type regions 32 and 34 may be formed as doping regions formed by doping the semiconductor substrate 10 with a dopant. That is, the first and second conductive type regions 32 and 34 may be formed as doping regions having a mono-crystalline semiconductor structure constituting a portion of the semiconductor substrate 10. This structure will be described below in more detail with reference to FIG. 4. The first and second conductive type regions 32 and 34 may be formed using various other methods.

The insulating layer 40 may be formed on the first and second conductive type regions 32 and 34 and the barrier region 36. The insulating layer 40 may prevent electrodes to which the first and second conductive type regions 32 and 34 must not be connected (i.e., the second electrode 44 for the first conductive type region 32 and the first electrode 42 for the second conductive type region 34) from being connected to each other and may passivate the first and second conductive type regions 32 and 34. The insulating layer 40 includes first openings 402 to expose the first conductive type regions 32 and second openings 404 to expose the second conductive type regions 34.

The insulating layer 40 may have the same or greater thickness than that of the tunneling layer 20. Accordingly, insulation and passivation characteristics may be enhanced. The insulating layer 40 may be formed of various insulating materials (e.g., an oxide, a nitride, or the like). For example, the insulating layer 40 may be any one film selected from the group consisting of a silicon nitride film, a hydrogen-containing silicon nitride film, a silicon oxide film, a silicon oxynitride film, an $Al_2O_3$ film, a $MgF_2$ film, a ZnS film, a $TiO_2$ film, and a $CeO_2$ film or have a multilayer structure including two or more of the above-listed films in combination. However, the embodiment of the invention is not limited to the above examples, and the insulating layer 40 may also include various other materials.

The electrodes 42 and 44 disposed on the back surface of the semiconductor substrate 10 include the first electrode 42 electrically and physically connected to the first conductive type region 32 and the second electrode 44 electrically and physically connected to the second conductive type region 34.

In this regard, the first electrode 42 is connected to the first conductive type region 32 via the first opening 402 of the insulating layer 40, and the second electrode 44 is connected to the second conductive type region 34 via the second opening 404 of the insulating layer 40. The first and second electrodes 42 and 44 may include various metal materials. In addition, the first and second electrodes 42 and 44 are not electrically connected to each other but are respectively connected to the first conductive type region 32 and the second conductive type region 34, and may have various planar shapes enabling collection of carriers generated and transfer of the collected carriers to the outside. However, the shapes of the first and second electrodes 42 and 44 are not limited to the above example.

Hereinafter, the first and second conductive type regions 32 and 34, the barrier regions 36, and the planar shapes of the first and second electrodes 42 and 44 will be described in detail with reference to FIG. 2.

Referring to FIG. 2, in the embodiment of the invention, the first and second conductive type regions 32 and 34 are formed long so as to have a stripe shape and alternately disposed with respect to each other in a direction crossing a longitudinal direction thereof. The barrier region 36 may be disposed to separate the first conductive type region 32 from the second conductive type region 34. Plural first conductive type regions 32 separated from each other may be connected to each other at an edge of a first side thereof, and plural second conductive type regions 34 separated from each other may be connected to each other at an edge of a second side thereof. However, the embodiment of the invention is not limited to the above examples. In the embodiment of the invention, the first boundary regions 32b may be respectively disposed at opposite sides of the first main region 32a, and the second boundary regions 34b may be respectively disposed at opposite sides of the second main region 34b.

In this regard, the first conductive type region 32 may have a wider area than the second conductive type region 34. For example, the areas of the first and second conductive type regions 32 and 34 may be adjusted by differently adjusting widths thereof. That is, a width W3 of the first conductive type region 32 may be greater than a width W4 of the second conductive type region 34. Thus, the area of the first conductive type regions 32 constituting an emitter region is sufficiently formed, which enables photoelectric conversion to occur in a wide region. In this regard, when the first conductive type regions 32 are of a p-type, the area of the first conductive type regions 32 is sufficiently secured and thus holes having a relatively slow movement rate may be effectively collected.

In addition, the first electrode 42 may be formed so as to have a stripe shape to correspond to the first conductive type region 32, and the second electrode 44 may be formed so as to have a stripe shape to correspond to the second conductive type region 34. The first and second openings 402 and 404 (see FIG. 1) may be formed to respectively correspond to total areas of the first and second electrodes 42 and 44. Thus, a contact area between the first electrode 42 and the first conductive type region 32 and a contact area between the second electrode 44 and the second conductive type region 34 are maximized and, accordingly, carrier collection efficiency may be enhanced. However, the embodiment of the invention is not limited to the above examples. In addition, the first and second openings 402 and 404 may also be formed so as to respectively connect only portions of the first and second electrodes 42 and 44 to the first and second conductive type regions 32 and 34. For example, the first and second openings 402 and 404 may be formed as a plurality of contact holes. The first electrodes 42 may be connected to each other at an edge of a first side thereof, and the second electrodes 44 may be connected to each other at an edge of a second side thereof. However, the embodiment of the invention is not limited to the above examples.

Referring back to FIG. 1, the passivation film 24 and/or the anti-reflective film 26 may be disposed on the front surface of the semiconductor substrate 10 (more particularly, the front surface field region 120 formed at the front surface of the semiconductor substrate 10). According to embodiments, only the passivation film 24 may be formed on the semiconductor substrate 10, only the anti-reflective film 26 may be formed on the semiconductor substrate 10, or the passivation film 24 and the anti-reflective film 26 may be sequentially disposed on the semiconductor substrate 10. FIG. 1 illustrates an instance in which the passivation film 24 and the anti-reflective film 26 are sequentially formed on the semiconductor substrate 10 and the semiconductor substrate 10 contacts the passivation film 24. However, the embodiment of the invention is not limited to the above examples, and the semiconductor substrate 10 may contact the anti-reflective film 26. In addition, various modifications are possible.

The passivation film 24 and the anti-reflective film 26 may be substantially entirely formed on the front surface of the semiconductor substrate 10. In this regard, the expression "entirely formed" as used herein includes an instance in which the passivation film 24 and the anti-reflective film 26 are physically completely formed and an instance in which the passivation film 24 and the anti-reflective film 26 are inevitably incompletely formed.

The passivation film 24 is formed on the front surface of the semiconductor substrate 10 in contact therewith and thus inactivates defects present in the front surface or bulk of the semiconductor substrate 10. Thus, recombination sites of minority carriers are removed and, accordingly, an open circuit voltage of the solar cell 100 may be increased. The anti-reflective film 26 reduces reflectance of light incident upon the front surface of the semiconductor substrate 10. Thus, the amount of light reaching a pn junction formed at an interface between the base region 110 and the first conductive type region 32 may be increased by reducing the reflectance of light incident upon the front surface of the semiconductor substrate 10. Accordingly, short-circuit current Isc of the solar cell 100 may be increased. As such, the open circuit voltage and the short-circuit current Isc of the solar cell 100 may be increased by the passivation film 24 and the anti-reflective film 26 and, accordingly, the efficiency of the solar cell 100 may be enhanced.

The passivation film 24 and/or the anti-reflective film 26 may be formed of various materials. For example, the passivation film 24 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. For example, the passivation film 24 may include silicon oxide, and the anti-reflective film 26 may include silicon nitride.

When light is incident upon the solar cell 100 according to the embodiment of the invention, electrons and holes are generated by photoelectric conversion at the pn junction formed between the base region 110 and the first conductive type regions 32, and the generated holes and electrons tunnel through the tunneling layer 20, respectively move to the first and second conductive type regions 32 and 34, and then respectively migrate to the first and second electrodes 42 and 44. Electric energy is generated thereby.

As in the embodiment of the invention, in the solar cell 150 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 may be minimized. Accordingly, efficiency of the solar cell 100 may be enhanced. However, the embodiment of the invention is not limited to the above examples. The structures of the first and second electrodes 42 and 44 according to the embodiment of the invention may be applied to the solar cell 150 having an electrode structure in which the first electrodes 42 are disposed on the front surface of the semiconductor substrate 10 (in particular, the second electrodes 44 disposed on the back surface of the solar cell 100).

In addition, in the embodiment of the invention, the first and second conductive type regions 32 and 34 respectively include the first and second boundary regions 32b and 34b and thus the areas of the first and second conductive type regions 32 and 34 participating in photoelectric conversion may be maximized. That is, when the barrier regions 36 are formed, the width of the barrier regions 36 may be minimized. In this regard, the size of the first conductive type regions 32 acting as an emitter region may further be increased by forming the width W1 of the first boundary regions 32b to be greater than the width W2 of the second boundary regions 34b. In this regard, when the first conductive type regions 32 are of a p-type and the second conductive type regions 34 are of an n-type, the widths W1 and W2 of the respective first and second boundary regions 32b and 34b may be easily adjusted without further performing separate manufacturing processes or further using separate devices. As such, by maximizing the areas of the first and second conductive type regions 32 and 34, in particular by further increasing the size of the first conductive type regions 32, the efficiency of the solar cell 100 may be enhanced.

Hereinafter, solar cells according to other embodiments of the invention will be described in more detail with reference to the accompanying drawings.

Figure 3:
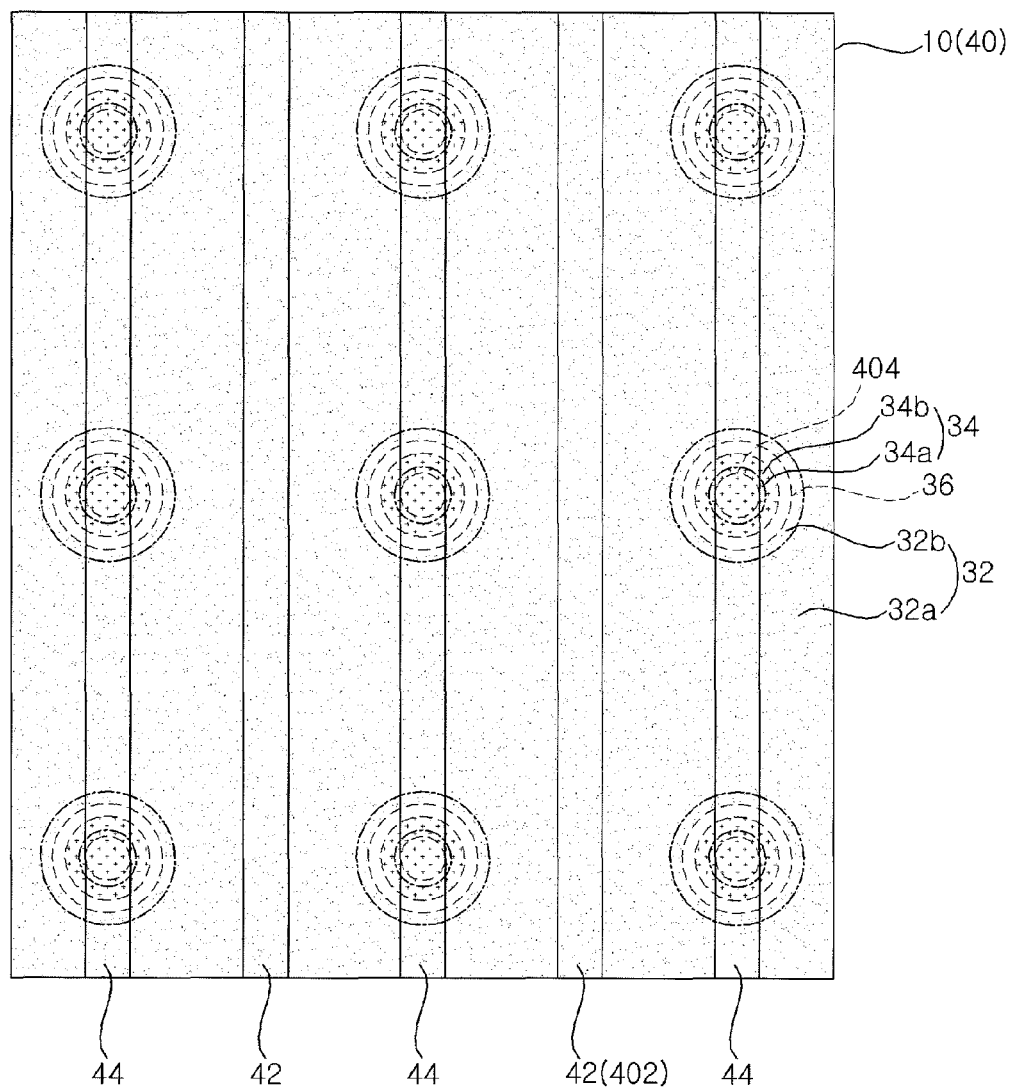
FIG. 3 is a partial rear plan view of a solar cell according to another embodiment of the invention.

FIG. 3 is a partial rear plan view of a solar cell 100 according to another embodiment of the invention.

Referring to FIG. 3, in the solar cell 100 according to the embodiment of the invention, plural second conductive type regions 34 may have an island shape and be spaced apart from each other, and the first conductive type region 32 may be entirely formed in a portion excluding the second conductive type regions 34 and the barrier region 36 surrounding each second conductive type region 34.

Due to such a configuration, the first conductive type region 32 has an area as wide as possible and thus photoelectric conversion efficiency may be enhanced. In addition, the second conductive type regions 34 may be disposed on the semiconductor substrate 10 with a large area while the first conductive type regions 32 have a minimized area. Accordingly, surface recombination may be effectively prevented or reduced by the second conductive type regions 34 and the area of the second conductive type regions 34 may be maximized. However, the embodiment of the invention is not limited to the above examples, and the second conductive type regions 34 may have various shapes that enable the second conductive type regions 34 to have a minimized area.

In this regard, the second main region 34a may have an island shape, and the second boundary region 34b may have a closed ring shape formed along an edge of the second main region 34a. For example, when the second main region 34a has a circular shape, the second boundary region 34b may have a ring shape. The first main region 32a may be entirely formed to be spaced apart from the second conductive type region 34 by a certain distance, and the first boundary region 32b may be arranged a certain distance from the second conductive type region 34 at an edge (an edge adjacent to the second conductive type region 34) of the first main region 32a. In this regard, the first boundary region 32b may have a closed ring shape formed along the edge of the first main region 32a. For example, when the second conductive type region 34 has a circular shape, the first boundary region 32b may be wider than the second boundary region 34b, spaced apart from the second boundary region 34b by a certain distance, and have a ring shape. However, the embodiment of the invention is not limited to the above examples, and the first and second boundary regions 32b and 34b may have various shapes.

Although FIG. 3 illustrates the second conductive type regions 34 as having a circular shape, the embodiment of the invention is not limited thereto. That is, each second conductive type regions 34 may also have a planar shape, for example, an oval shape or a polygonal shape such as a triangle, a tetragon, a hexagon, or the like.

The first and second openings 402 and 404 formed in the insulating layer 40 may have different shapes in consideration of shapes of the respective first and second conductive type regions 32 and 34. That is, the first opening 402 may extend long on the first conductive type region 32, and plural second openings 404 may be spaced apart from each other to correspond to the respective second conductive type regions 34. This is considering that the first electrode 42 is disposed only on the first conductive type region 32, and the second electrode 44 is disposed on the first and second conductive type regions 32 and 34. That is, the second openings 404 of the insulating layer 40 are formed to correspond to portions in which the second conductive type regions 34 are disposed, and the second electrode 44 and the second conductive type region 34 are connected by the second opening 404. In addition, the second openings 404 are not formed in portions of the insulating layer corresponding to the first conductive type regions 32 and thus the second electrodes 44 may be insulated from the first conductive type regions 32. The first electrode 42 is formed only on each first conductive type region 32 and thus the first opening 402 may have the same or similar to that of the first electrode 42 and, accordingly, the first electrodes 42 may entirely contact the first conductive type regions 32 thereon. However, the embodiment of the invention is not limited to the above examples and various modifications are possible. For example, the first openings 402 may be formed as a plurality of contact holes having a similar shape to that of the second openings 404.

Figure 4:
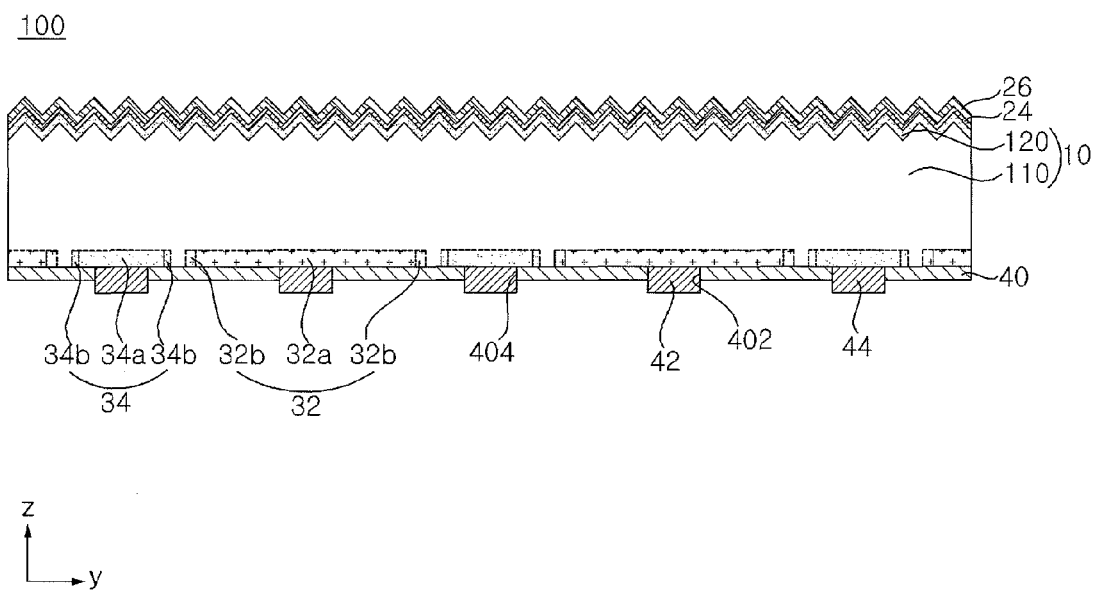
FIG. 4 is a sectional view of a solar cell according to another embodiment of the invention.

FIG. 4 is a sectional view of a solar cell 100 according to another embodiment of the invention.

Referring to FIG. 4, in the solar cell 100 according to the embodiment of the invention, the tunneling layer 20 (see FIG. 1) is not formed and the first and second conductive type regions 32 and 34 may be formed as doping regions formed by doping the semiconductor substrate 10 with a dopant. That is, the first and second conductive type regions 32 and 34 may be formed as doping regions having a mono-crystalline semiconductor structure constituting a portion of the semiconductor substrate 10.

In this regard, the base region 110 is disposed between the first and second conductive type regions 32 and 34. In this instance, a starting point of the first boundary region 32b having a conductive type opposite that of the base region 110 is a point at which a doping concentration of a first conductive type impurity is approximately 0, while a starting point of the second boundary region 34b having the same conductive type as that of the base region 110 is a point at which a doping concentration of a second conductive type impurity is approximately the same or similar to a doping concentration of the base region 110.

For example, a first point directing from the first main region 32a to the outside and having a decreased doping concentration by 10% or more than the first concentration may be denoted as the starting point of the first boundary region 32b, and a first point directing from the first main region 32a to the outside and having a doping concentration of approximately 0 may be denoted as the end point of the first boundary region 32b. However, the embodiment of the invention is not limited to the above examples, and basis for determination of the first boundary regions 32b may be variously changed.

In addition, a first point directing from the second main region 34a to the outside and having a decreased doping concentration by 10% or more than the first concentration may be denoted as the starting point of the second boundary region 34b, and a first point directing from the second main region 34a to the outside and having a doping concentration of 10% or less and a doping concentration of the base region 10 of 10% or less may be denoted as the end point of the second boundary region 34b. However, the embodiment of the invention is not limited to the above examples, and basis for determination of the first boundary regions 32b may be variously changed.

As such, when the first and second conductive type regions 32 and 34 are formed as a portion of the semiconductor substrate 10, the first and second conductive type regions 32 and 34 have a mono-crystalline semiconductor structure and, accordingly, photoelectric conversion efficiency may be enhanced by high mobility due to the mono-crystalline semiconductor structure.

Figure 5:
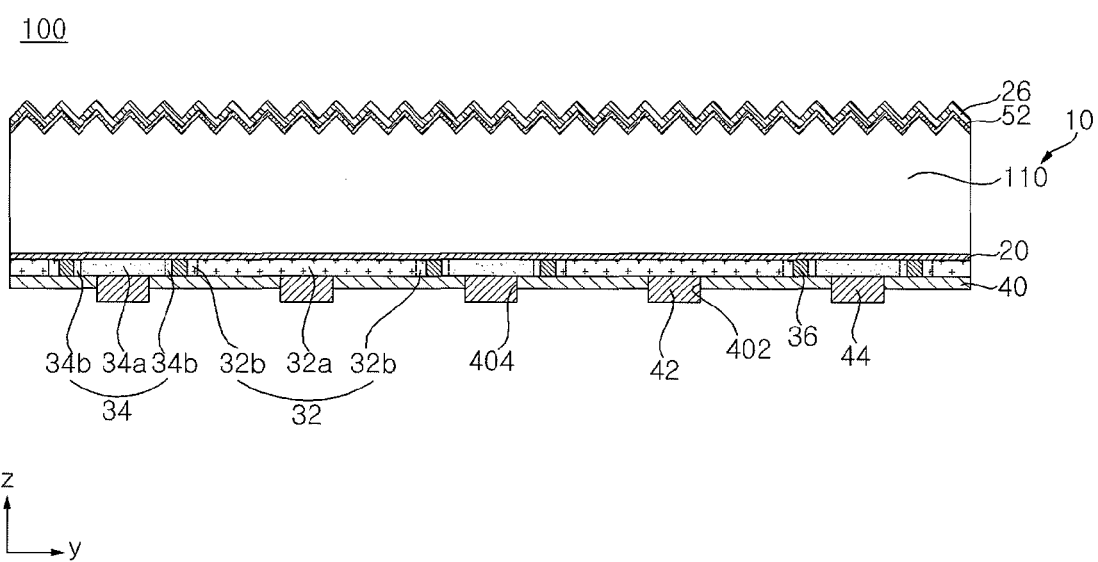
FIG. 5 is a sectional view of a solar cell according to another embodiment of the invention.

FIG. 5 is a sectional view of a solar cell 100 according to another embodiment of the invention.

Referring to FIG. 5, in the solar cell 100 according to the embodiment of the invention, the semiconductor substrate 10 includes only the base region 110 and does not include the front surface field layer 120 (see FIG. 1). Instead of the front surface field layer 120, a field effect formation layer 52 contacting the base region 110 of the semiconductor substrate 10 and having fixed charges is formed. The field effect formation layer 52 generates a constant field effect as in the front surface field layer 120 and thus may prevent surface recombination. The field effect formation layer 52 may be formed of an aluminum oxide having a negative charge (or a negative fixed charge), a silicon oxide having a positive charge (or a positive fixed charge), a silicon nitride having a positive charge, or the like.

As such, in the embodiment of the invention, the semiconductor substrate 10 does not include a separate doping region and includes only the base region 110. Accordingly, a process for forming a separate doping region need not be performed and thus manufacturing processes may be simplified. Deterioration of the characteristics of the solar cell 100 by damage to the semiconductor substrate 10 when doped to form a separate doping region may be prevented or reduced.

Hereinafter, various examples of solar cell manufacturing methods according to embodiments of the invention will be described in detail with reference to the accompanying drawings. A detailed description of the elements described above will be omitted herein and a detailed description of elements that have not been described will be provided herein. In addition, hereinafter, manufacturing methods of the solar cell illustrated in FIGS. 1 and 2 will be described, but the manufacturing methods according to the embodiments of the invention may also be applied to the solar cells illustrated in FIGS. 3 to 5.

FIGS. 6A to 6I are sectional views sequentially illustrating a solar cell manufacturing method according to an embodiment of the invention.

Figure 6A:
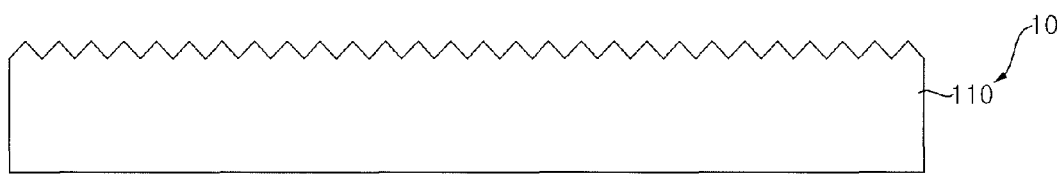
FIGS. 6A to 6I are sectional views illustrating a solar cell manufacturing method according to an embodiment of the invention.

First, as illustrated in FIG. 6A, the semiconductor substrate 10 including the base region 110 having a first conductive type impurity is prepared. In the embodiment of the invention, the semiconductor substrate 10 may be made of silicon having an n-type impurity. The n-type impurity may be a Group V element such as P, As, Bi, Sb, or the like.

In this regard, a front surface of the semiconductor substrate 10 is textured so as to have an uneven portion, and a back surface of the semiconductor substrate 10 is treated by mirror polishing or the like and thus may have a lower surface roughness than the front surface thereof.

Texturing of the front surface of the semiconductor substrate 10 may be performed by wet texturing or dry texturing. Wet texturing may be performed by immersing the semiconductor substrate 10 in a texturing solution and is advantageous in that manufacturing time is short. Dry texturing is carried out by cutting a surface of the semiconductor substrate 10 using a diamond drill, a laser or the like. In dry texturing, irregularities may be uniformly formed, while manufacturing time is long and damage to the semiconductor substrate 110 may occur. In addition, the semiconductor substrate 10 may be textured by reactive ion etching (RIE) or the like. As such, the semiconductor substrate 10 may be textured using various methods. In addition, the back surface of the semiconductor substrate 10 may be treated by a known mirror polishing process.

Figure 6B:
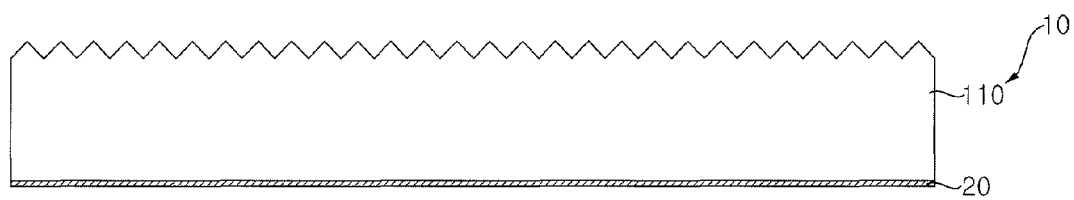

Subsequently, as illustrated in FIG. 6B, the tunneling layer 20 is formed on the back surface of the semiconductor substrate 10. The tunneling layer 20 may be formed by, for example, thermal growth, deposition (e.g., plasma-enhanced chemical vapor deposition (PECVD) or atomic layer deposition (ALD)), or the like. However, the embodiment of the invention is not limited to the above examples and the tunneling layer 20 may be formed using various methods.

Figure 6C:
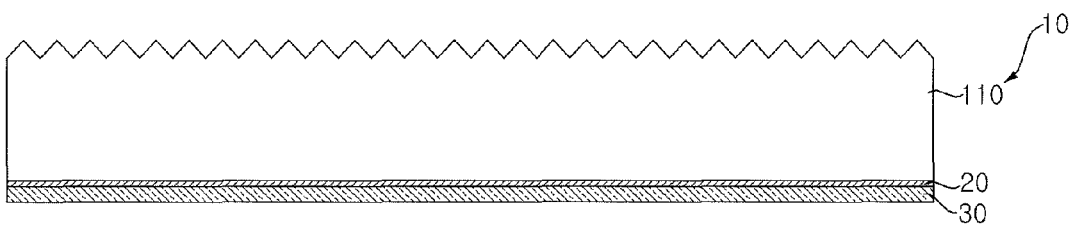

Subsequently, as illustrated in FIG. 6C, a semiconductor layer 30 is formed on the tunneling layer 20. The semiconductor layer 30 may be formed of a micro-crystalline semiconductor, an amorphous semiconductor, or a polycrystalline semiconductor. The semiconductor layer 30 may be formed by, for example, thermal growth, deposition (e.g., PECVD), or the like. However, the embodiment of the invention is not limited to the above examples and the semiconductor layer 30 may be formed using various methods.

Figure 6D:
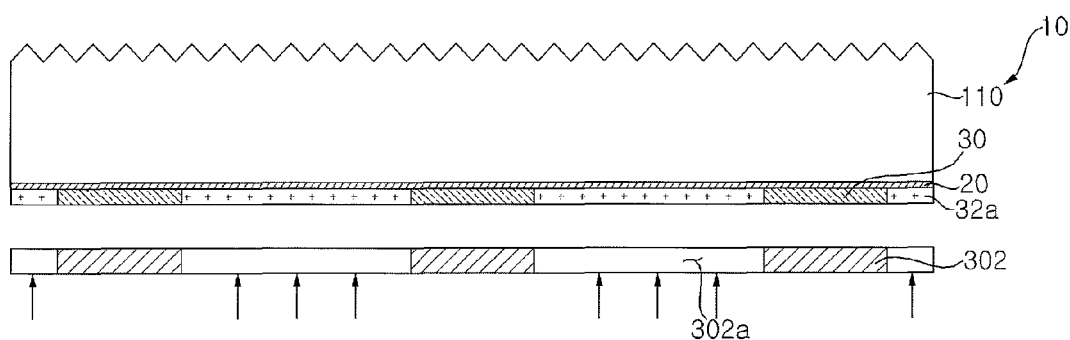
Figure 6E:
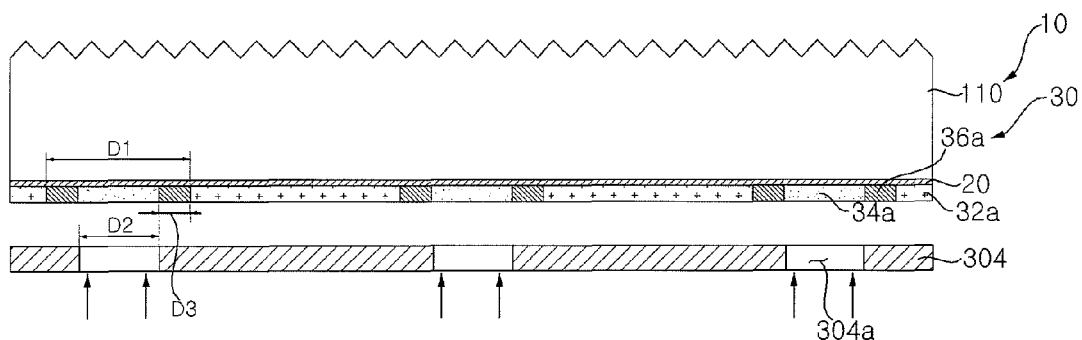
Figure 6F:
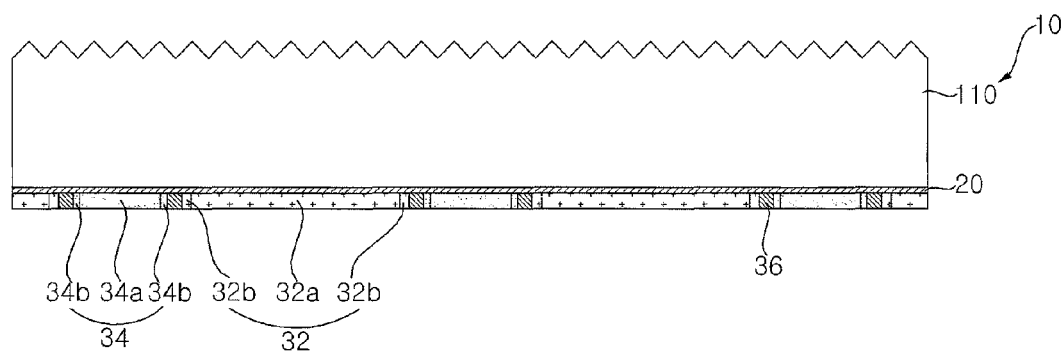

Subsequently, as illustrated in FIGS. 6D to 6F, the first conductive type regions 32, the second conductive type regions 34, and the barrier regions 36 are formed on the semiconductor layer 30. This will be described below in more detail.

That is, as illustrated in FIG. 6D, portions corresponding to the first main regions 32a may be doped with a first conductive type impurity so as to have patterns corresponding to the first main region 32a of each first conductive type region 32. In this regard, the first conductive type impurity may be doped by ion implantation using, as a mask, a first mask member 302 having first openings 302a corresponding to the first main regions 32a. In this regard, the first opening 302a may have the same size as that of the first main region 32a or have a somewhat smaller size than the first main region 32a desired. This is because, even when the first opening 302a has a somewhat smaller size than the first main region 32a, the first conductive type impurity having passed through the first openings 302a diffuses and, consequently, the first main regions 32a having a desired size may be formed. However, the embodiment of the invention is not limited to the above examples and the first openings 302a may have a greater size than the first main regions 32a according to manufacturing conditions.

Although FIG. 6D illustrates that the first conductive type impurity is doped into a total thickness of the semiconductor layer 30 at the portions of the semiconductor layer 30 corresponding to the first main regions 32a and thus the first main regions 32a are entirely formed in a thickness direction, practically, the first conductive type impurity is disposed only at a surface of the semiconductor layer 30 into which ion implantation is performed and thus the first main regions 32a may be formed only at the surface thereof.

Subsequently, as illustrated in FIG. 6E, portions corresponding to the second main regions 34a may be doped with a second conductive type impurity so as to have patterns corresponding to the second main region 34a of each second conductive type region 34. In this regard, the second conductive type impurity may be doped by ion implantation using, as a mask, a second mask member 304 having second openings 304a corresponding to the second main regions 34a. In this regard, each second opening 304a of the second mask member 304 has a width D2 that is smaller than a distance D1 between the first main regions 32a and thus an area between the first main region 32a and the second main region 34a may be undoped. Accordingly, an undoped region 36a is formed between the first main region 32a and the second main region 34a. A width D3 of the undoped region 36a corresponds to half of a value obtained by subtracting the width D2 of the second opening 304a from the distance D1 between the first main regions 32a.

In this regard, the second opening 304a may have the same size as that of the second main region 34a or have a somewhat smaller size than the second main region 34a desired. This is because, even when the second opening 304a has a somewhat smaller size than the second main region 34a, the second conductive type impurity having passed through the second openings 304a diffuses and, consequently, the second main regions 34a having a desired size may be formed. However, the embodiment of the invention is not limited to the above examples and the second openings 304a may have a greater size than the second main regions 34a according to manufacturing conditions.

Although FIG. 6E illustrates that the second conductive type impurity is doped into a total thickness of the semiconductor layer 30 at the portions of the semiconductor layer 30 corresponding to the second main regions 34a and thus the second main regions 34a are entirely formed in a thickness direction, practically, the second conductive type impurity is disposed only at a surface of the semiconductor layer 30 into which ion implantation is performed and thus the second main regions 34a may be formed only at the surface thereof.

In the embodiment of the invention, the first main regions 32a are formed before the second main regions 34a, but the embodiment of the invention is not limited thereto. In another embodiment, the second main regions 34a may first be formed using the second mask member 304 and then the first main regions 32a may be formed using the first mask member 302. The first openings 302a of the first mask member 302 has a width that is smaller than a distance between the second main regions 34a, which enables the undoped region 36a to be disposed between the first and second main regions 32a and 34a.

Subsequently, as illustrated in FIG. 6F, the first conductive type impurity included in the first main regions 32a and the second conductive type impurity included in the second main regions 34a are activated through an activated heat-treatment process. Accordingly, the first conductive type impurity included in the first main regions 32a is activated and diffuses in a thickness direction of the semiconductor layer 30 (see FIG. 6E). In addition, the first conductive type impurity partially diffuses outside of the first main regions 32a, thereby forming the first boundary regions 32b. In addition, the second conductive type impurity included in the second main regions 34a is activated and diffuses in a thickness direction of the semiconductor layer 30. In addition, the second conductive type impurity partially diffuses outside of the second main regions 34a, thereby forming the second boundary regions 34b.

Thus, the first and second boundary regions 32b and 34b are formed in portions of the undoped regions 36a (see FIG. 6E) and thus the barrier region 36 disposed between the first and second conductive type regions 32 and 34 may have a smaller width than the undoped region 36a. Accordingly, the width of the barrier region 36 disposed between the first and second conductive type regions 32 and 34 may be minimized.

In this regard, when boron (B) is used as the first conductive type impurity and phosphorus (P) is used as the second conductive type impurity, the first conductive type impurity that is relatively small and light has a longer diffusion length than the second conductive type impurity that is relatively big and heavy. Accordingly, the first boundary regions 32b may have a relatively greater width than the second boundary regions 34b.

Figure 6G:
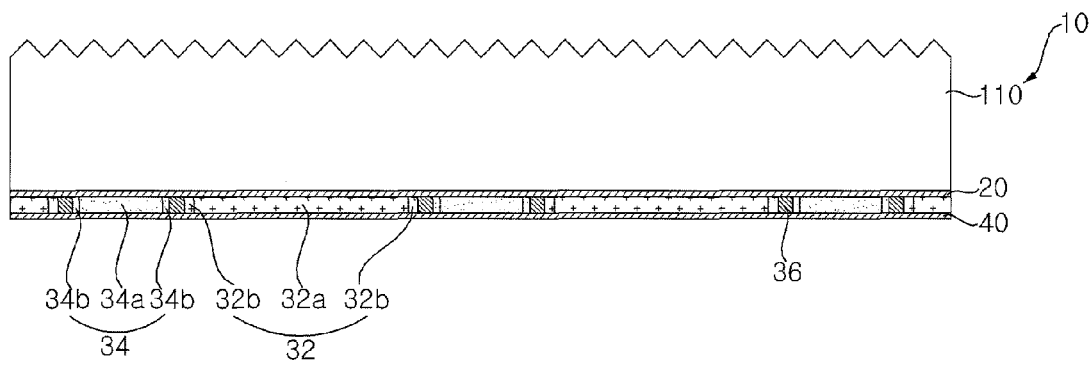

Subsequently, as illustrated in FIG. 6G, the insulating layer 40 is formed on the first and second conductive type regions 32 and 34 and the barrier regions 36. The insulating layer 40 may be formed by various methods such as vacuum deposition, chemical vapor deposition, spin coating, screen-printing, spray coating, or the like.

Figure 6H:
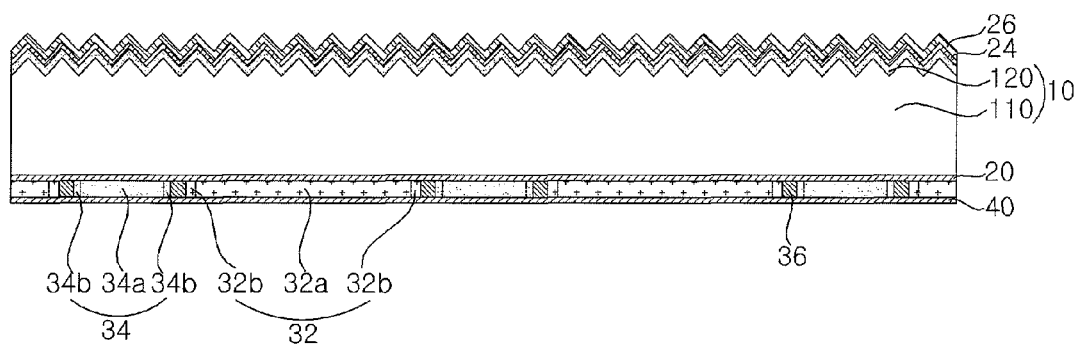

Subsequently, as illustrated in FIG. 6H, the front surface field layer 120, the passivation film 24, and the anti-reflective film 26 are formed on the front surface of the semiconductor substrate 10.

The front surface field layer 120 may be formed through doping with a first conductive type impurity. For example, the front surface field layer 120 may be formed by doping the semiconductor substrate 10 with a first conductive type impurity by using various methods such as ion implantation, thermal diffusion, or the like.

The passivation film 24 and the anti-reflective film 26 may be formed by various methods such as vacuum deposition, chemical vapor deposition, spin coating, screen-printing, spray coating, or the like.

Figure 6I:
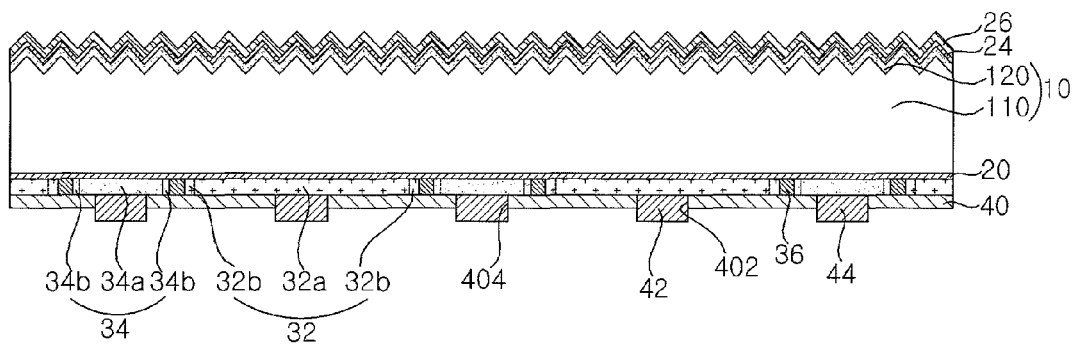

Subsequently, as illustrated in FIG. 6I, the first and second electrodes 42 and 44 electrically connected respectively to the first and second conductive type regions 32 and 34 are formed.

In an embodiment, the first and second openings 402 and 404 are formed in the insulating layer 140, and the first and second electrodes 42 and 44 may be formed in the first and second openings 402 and 404 by various methods such as plating, deposition, or the like.

In another embodiment, the first and second electrodes 42 and 44 having the above-described shapes may be formed by respectively applying pastes for forming first and second electrodes on the insulating layer 40 by screen-printing or the like and performing a fire through, a laser firing contact, or the like thereon. In this instance, when the first and second electrodes 42 and 44 are formed, the first and second openings 402 and 404 are formed, and thus, a separate process (a process illustrated in FIG. 6J) of forming the first and second openings 402 and 404 need not be performed.

According to the embodiment of the invention, the first and second boundary regions 32a and 34a may be easily formed by doping the semiconductor layer 30 with a first or second conductive type impurity by ion implantation and performing an activated heat-treatment process thereon, and the widths of the first and second boundary regions 32a and 34b may be easily adjusted. Accordingly, the solar cell 100 having an improved structure may be easily manufactured using simplified manufacturing processes. However, the embodiment of the invention is not limited to the above examples and the first and second boundary regions 32a and 34a may be formed using various methods.

In the foregoing embodiment, the tunneling layer 20, the first and second conductive type regions 32 and 34, the barrier regions 36, and the insulating layer 40 are formed and then the front surface field layer 120 and the anti-reflective film 50 are formed, followed by formation of the first and second electrodes 42 and 44. However, the embodiment of the invention is not limited to the above example. That is, the order of formation of the tunneling layer 20, the first and second conductive type regions 32 and 34, the barrier regions 36, the insulating layer 40, the front surface field layer 120, the anti-reflective film 50, and the first and second electrodes 42 and 44 may be variously changed.

Hereinafter, solar cell manufacturing methods according to other embodiments of the invention will be described in detail. A detailed description of the same or almost the same elements as those described above with reference to FIGS. 6A to 6I will be omitted herein and a detailed description of only different elements will be provided herein.

FIGS. 7A to 7F are sectional views illustrating a solar cell manufacturing method according to another embodiment of the invention.

Figure 7A:
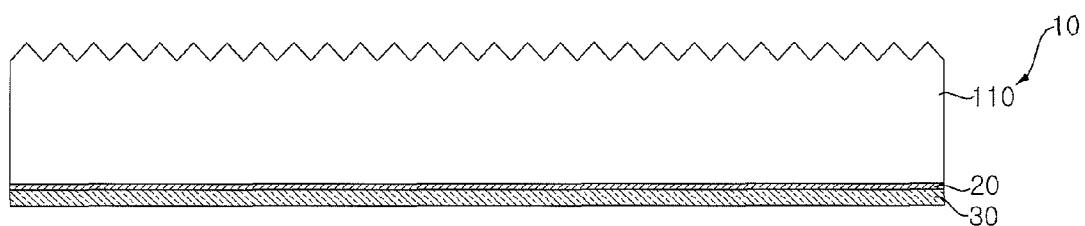
FIGS. 7A to 7F are sectional views illustrating a solar cell manufacturing method according to another embodiment of the invention.

As illustrated in FIG. 7A, the tunneling layer 20 and the semiconductor layer 30 are formed on a back surface of the semiconductor substrate 10.

Subsequently, as illustrated in FIGS. 7B to 7E, the first and second conductive type regions 32 and 34 and the barrier regions 36 are formed on the semiconductor layer 30. This will be described below in more detail.

Figure 7B:
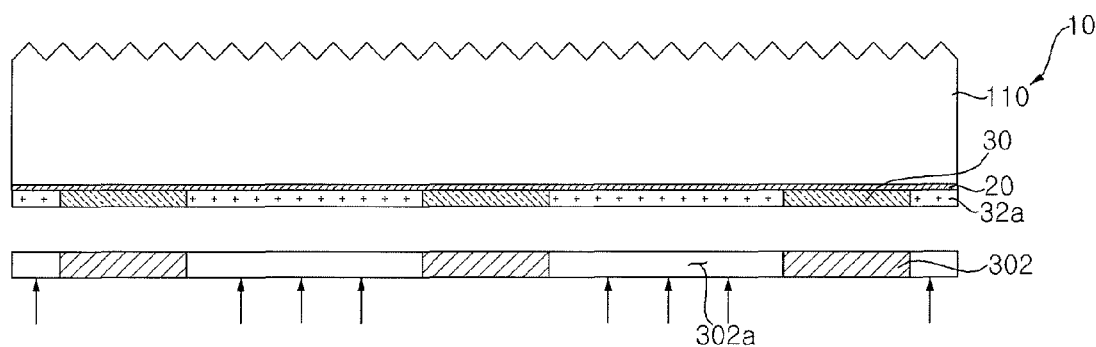

That is, as illustrated in FIG. 7B, the first main region 32a of each first conductive type region 32 is formed. A process of forming the first main regions 32a is the same or similar to that described above with reference to FIG. 6D and thus a detailed description thereof will be omitted herein.

Figure 7C:
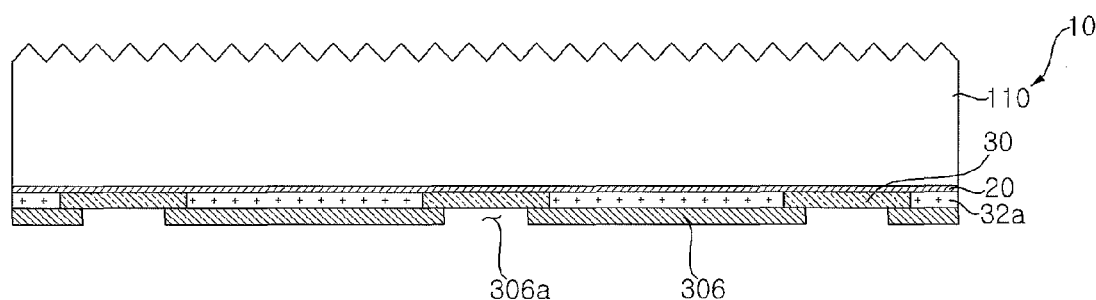

Subsequently, as illustrated in FIG. 7C, a barrier member 306 having openings 306a at portions corresponding to the second main regions 34a may be formed so as to have patterns corresponding to the second main regions 34a of the respectively second conductive type regions 34. The barrier member 306 may be formed as a layer including an undoped material excluding first and second conductive type impurities or an insulating material. In this regard, a paste for forming the barrier member 306 may be applied on the semiconductor layers 30 and the first main regions 32a so as to have a shape (or pattern) covering the first main regions 32a and the semiconductor layers 30 in the vicinity thereof. Accordingly, the openings 306a of the barrier member 306 expose the semiconductor layers 30 so as to have a smaller width or area than an area between the first main regions 32a.

The paste for forming the barrier member 306 may be various known compositions that may be easily applied. For example, the paste for forming the barrier member 306 may include ceramic particles, a binder, a solvent, or the like. The ceramic particles may be particles of a metal oxide such as silicon oxide, titanium oxide, or the like. Accordingly, the barrier member 306 having excellent structural and chemical stability may be formed. As the binder and solvent, various known materials may be used. However, the embodiment of the invention is not limited to the above examples and various other materials may also be used.

In addition, the barrier member 306 may have a thickness of 0.5 μm to 10 μm. When the thickness of the barrier member 306 is less than 0.5 μm, the second conductive type impurity passes through the barrier member 306 and thus may diffuse into the semiconductor substrate 10. Accordingly, the barrier regions 36 need not be smoothly formed. When the thickness of the barrier member 306 exceeds 10 μm, it is difficult to form the barrier regions 36 by performing printing, dispensing, or the like once and thus preparation processes have to be repeated a plurality of times. Accordingly, manufacturing processes may be complicated and the structural stability of the barrier member 306 may be reduced.

The barrier member 306 prevents a first or second conductive type impurity from being doped and thus undoped regions 36a are disposed at portions of the semiconductor layers 30 corresponding thereto.

In this regard, the description of the second openings 304a formed in the second mask member 304 of FIG. 6E may be applied to the openings 306a of the barrier member 306, and thus, a detailed description of the openings 306a will be omitted herein.

Figure 7D:
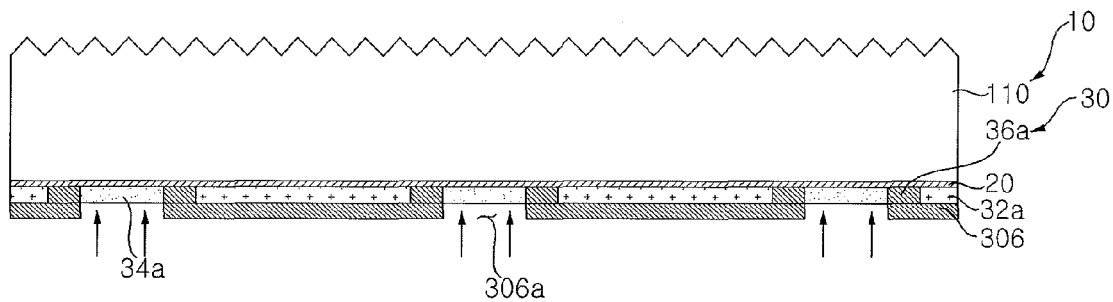

Subsequently, as illustrated in FIG. 7D, the second conductive type impurity may be doped using the barrier member 306 as a mask. In the embodiment of the invention, the first main regions 32a are formed before the second main regions 34a, but the embodiment of the invention is not limited thereto. That is, the second main regions 34a may first be formed using the second mask member 34 (see FIG. 6E), the barrier member 306 may be formed so as to cover the second main regions 34a and peripheral regions thereof, and then the first conductive type impurity may be doped to form the first main regions 32a. In this regard, the description of the first openings 302a formed in the first mask member 302 of FIG. 6D may be applied to the openings 306a of the barrier member 306, and thus, a detailed description of the openings 306a will be omitted herein.

Figure 7E:
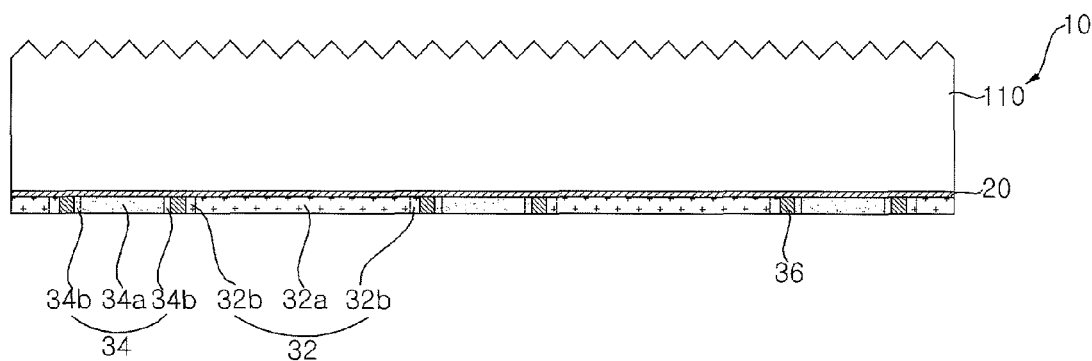

Subsequently, as illustrated in FIG. 7E, the first conductive type impurity included in the first main regions 32a and the second conductive type impurity included in the second main regions 34a are activated through an activated heat-treatment process. Accordingly, the first and second boundary regions 32b and 34b are formed.

The barrier member 306 may be removed before or after the activated heat-treatment process. The barrier member 306 may be removed using various known methods. For example, the barrier member 306 may be removed through immersion in diluted HF and washing with water. However, the embodiment of the invention is not limited to the above examples.

Figure 7F:
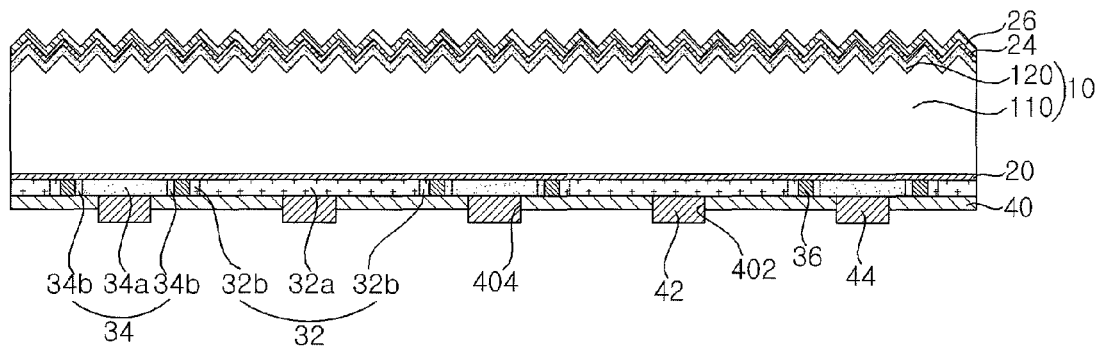

Subsequently, as illustrated in FIG. 7F, the insulating layer 40, the passivation film 24, the anti-reflective film 26, and the first and second electrodes 42 and 44 are formed.

In the embodiment of the invention, one of the first and second conductive type regions 32 and 34 is formed using the barrier member 306 as a mask. Thus, problems (e.g., mask costs, drooping of a mask, and the like) occurring when a separate mask member is used may be prevented or reduced. Although FIG. 7D illustrates that one of the first and second conductive type regions 32 and 34 is formed using the barrier member 306 as a mask, the embodiment of the invention is not limited thereto. That is, the first and second conductive type regions 32 and 34 may be formed respectively using the barrier members 306 corresponding thereto as masks. In addition, various modifications are possible.

FIGS. 8A to 8F are sectional views sequentially illustrating a solar cell manufacturing method according to another embodiment of the invention.

Figure 8A:
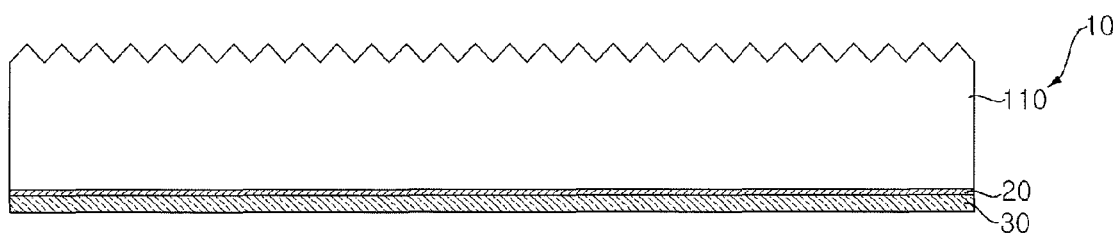
FIGS. 8A to 8F are sectional views illustrating a solar cell manufacturing method according to another embodiment of the invention.

As illustrated in FIG. 8A, the tunneling layer 20 and the semiconductor layer 30 are formed on a back surface of the semiconductor substrate 10.

Subsequently, as illustrated in FIGS. 8B to 8E, the first and second conductive type regions 32 and 34 and the barrier regions 36 are formed on the semiconductor layer 30. This will be described below in more detail.

Figure 8B:
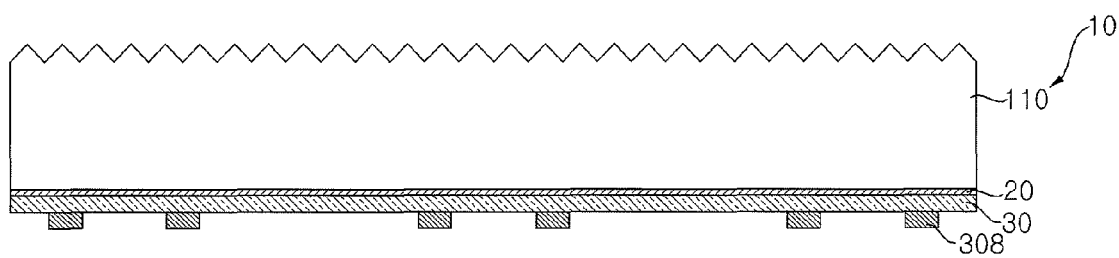

That is, as illustrated in FIG. 8B, barrier members 308 are formed on the semiconductor layer 30 so as to include portions corresponding to the barrier regions 36. The barrier members 308 may be formed by applying a paste for forming the barrier members 308 on the semiconductor layer 30 by printing, dispensing, or the like so as to have patterns including portions corresponding to the barrier regions 36. As the paste for forming the barrier members 308, the paste for forming the barrier member 306 according to the aforementioned embodiment may be used, and thus, a detailed description thereof will be omitted herein.

Each barrier member 308 may have substantially the same width (i.e., a width corresponding to a sum of the widths of the barrier region 36 and the first and second boundary regions 32b and 34b adjacent thereto) as that of the undoped region 36a (see FIG. 8E) and has a greater width than the barrier region 36 to be formed. This is because, when the first and second conductive type impurities are heat-treated by a subsequent activated heat-treatment process, the first and second conductive type impurities diffuse into peripheral portions of the first and second main regions 32a and 34a, thereby forming the first and second boundary regions 32b and 34b. As such, when the first and second boundary regions 32b and 34b are formed, the undoped regions 36a partially constitute the first and second conductive type regions 32 and 34 and thus the width of the barrier region 36 is smaller than the undoped region 36a. The thickness of the barrier member 308 is the same as that of the barrier member 306 according to the above embodiment and thus a detailed description thereof will be omitted herein.

Figure 9:
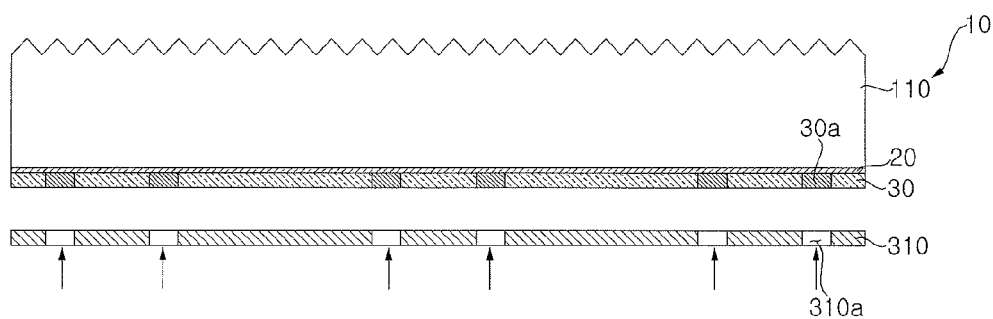
FIG. 9 is a modified example of a process illustrated in FIG. 8B.

In the embodiment of the invention, the barrier members 308 are separately formed in regions corresponding to the undoped regions 36a, which enables the undoped regions 36a not to be doped. However, the embodiment of the invention is not limited to the above example. In another embodiment, as illustrated in FIG. 9, a preamorphized element may be doped into regions corresponding to the undoped regions 36a in a state in which a mask member 310 having openings 310a is positioned at a back surface of the semiconductor substrate 10. As a result, the undoped regions 36a are preamorphized by the preamorphized element and thus, in a subsequent process, may be not doped with first and second conductive type impurities or may have a small thickness or a low doping thickness although doped therewith. That is, amorphous regions 30a are formed to correspond to the undoped regions 36a and thus may be used to prevent the first and second conductive type impurities from being doped as in the barrier member 308. After activated heat treatment, the amorphous regions 30a may have the same crystal structure (e.g., a polycrystalline structure) as that of the first and second conductive type regions 32 and 34. In addition, the first and second conductive type impurities from the first and second main regions 32a and 34a diffuse into portions disposed at opposite sides of each amorphous region 30a, thereby forming the first and second boundary regions 32b and 34b, and inner portions of the first and second boundary regions 32b and 34b constitute the barrier region 36.

The preamorphized element is an element for forming the amorphous regions 30a in the semiconductor layer 30 before doping the semiconductor layer 30 with the first and second conductive type impurities and requires no adverse effect on electrical characteristics and the like of the semiconductor layer 30, similar properties to those of the semiconductor layer 30, or no reactivity with the semiconductor layer 30. Examples of the preamorphized element include, but are limited to, argon, germanium, silicon, and fluorine.

The preamorphized element may have the same or larger element number than an element constituting the semiconductor layer 30 and thus have the same or larger mass, size and the like than the element constituting the semiconductor layer 30. However, the preamorphized element may be an element (e.g., fluorine) having a smaller element number than the element constituting the semiconductor layer 30 when injection amount, injection energy and the like of the preamorphized element are large.

In the embodiment of the invention, the preamorphized element may be injected in an amount sufficient to form the amorphous regions 30a to a small thickness and to prevent the amorphous regions 30a from being doped with the first and second conductive type impurities. The injection amount and the like of the preamorphized element may vary according to manufacturing conditions and the like.

In the following description, description related to the barrier member 308 may be applied to the amorphous regions 30a.

Figure 8C:
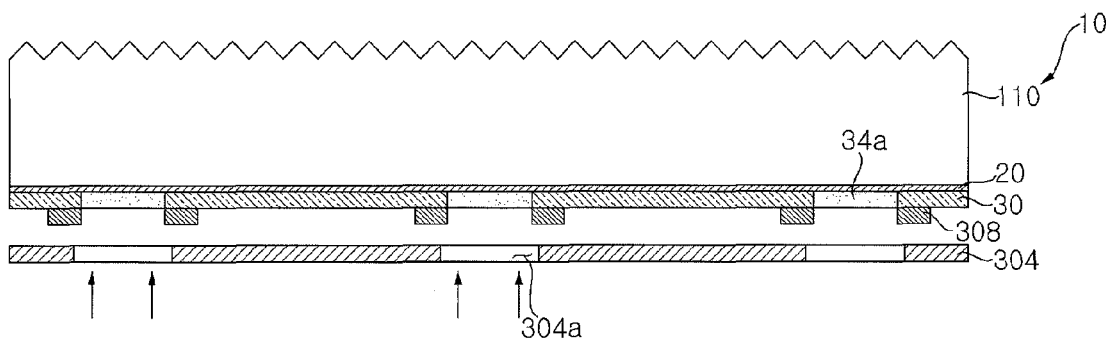

Subsequently, as illustrated in FIG. 8C, the second main regions 34a are formed by doping with a second conductive type impurity using the second mask member 304. Accordingly, the second openings 304a of the second mask member 304 may have a larger width than the second main regions 34a as desired. This is because the barrier members 308 may prevent regions except for the second main regions 34a from being doped with the second conductive type impurity. Thus, the second openings 304a may partially or completely overlap with the barrier members 308. Accordingly, although manufacturing errors and the like occur when fabricating the second mask member 304, the second main regions 34a having a desired size may be formed and thus burden of accuracy in fabrication of the second mask member 304 may be alleviated.

Figure 8D:
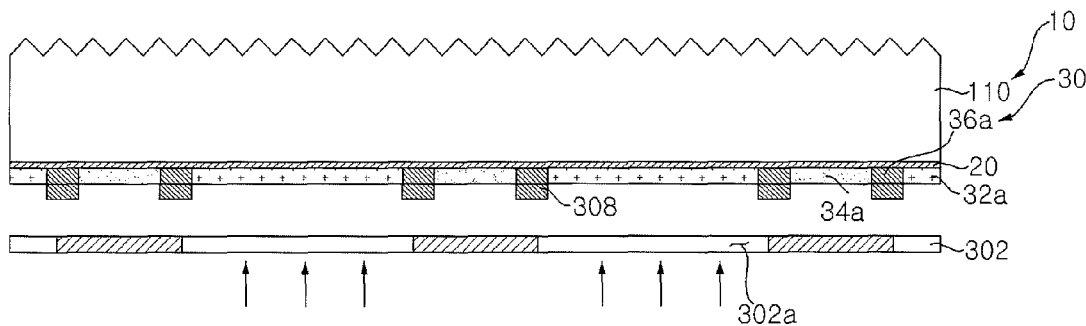

Subsequently, as illustrated in FIG. 8D, the first main regions 32a are formed by doping with a first conductive type impurity using the first mask member 302. Accordingly, the first openings 302a of the first mask member 302 may have a larger width than the first main regions 32a as desired. This is because the barrier members 308 may prevent regions except for the first main regions 32a from being doped with the first conductive type impurity. Thus, the first openings 302a may partially or completely overlap with the barrier members 308. Accordingly, although manufacturing errors and the like occur when fabricating the first mask member 302, the first main regions 32a having a desired size may be formed and thus burden of accuracy in fabrication of the first mask member 302 may be alleviated.

In the embodiment of the invention, the second main regions 34a are formed before the first main regions 32a, but the embodiment of the invention is not limited thereto. In another embodiment, the first main regions 32a may be formed using the first mask member 302 and then the second main regions 34a may be formed using the second mask member 304.

Figure 8E:
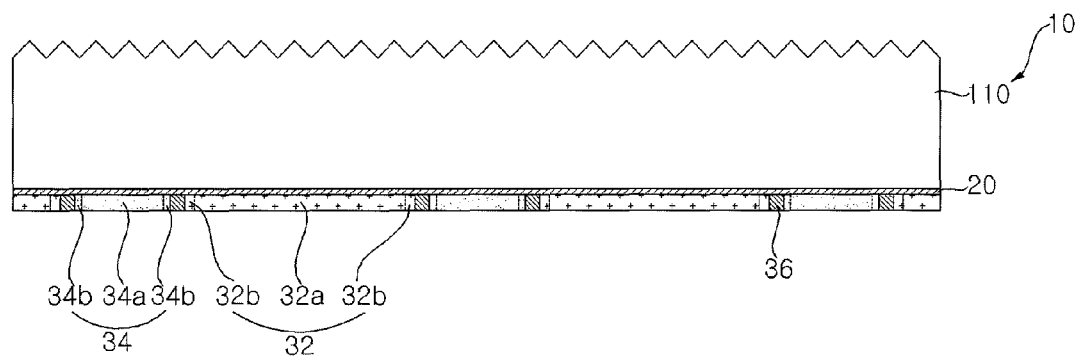

Subsequently, as illustrated in FIG. 8E, the first conductive type impurity included in the first main regions 32a and the second conductive type impurity included in the second main regions 34a are activated through an activated heat-treatment process. Accordingly, the first and second boundary regions 32b and 34b are formed.

The barrier members 308 may be removed before or after the activated heat-treatment process. The barrier members 308 may be removed using various known methods. For example, the barrier members 308 may be removed through immersion in diluted HF and washing with water. However, the embodiment of the invention is not limited to the above examples.

Figure 8F:
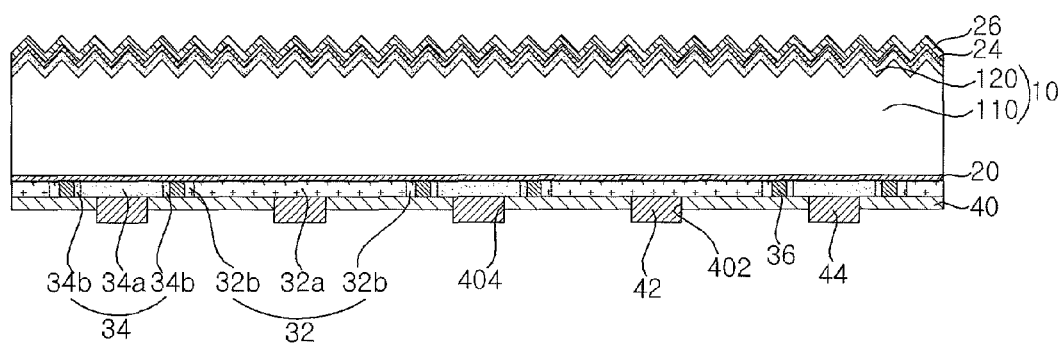

Subsequently, as illustrated in FIG. 8F, the insulating layer 30, the passivation film 24, the anti-reflective film 36, and the first and second electrodes 42 and 44 are formed.

In the above-described embodiment, the first and second boundary regions 32b and 34b of the respective first and second conductive type regions 32 and 34 have a uniform width over a total thickness and are disposed at outer sides of the first and second main regions 32a and 34a, respectively. However, the embodiment of the invention is not limited to the above examples.

Figure 10:
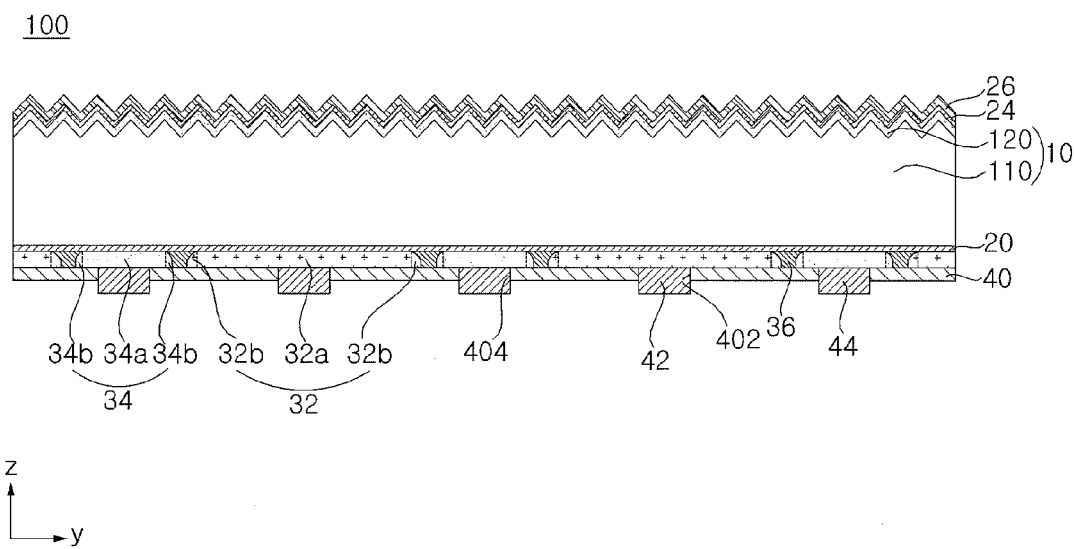
FIG. 10 is a sectional view of a solar cell according to another embodiment of the invention.

That is, in an instance in which the first and second conductive type impurities are injected only in the vicinity of a surface of the semiconductor layer 30 to a small thickness during ion implantation, the first and second conductive type impurities have to diffuse both in a lateral direction and in a thickness direction when diffused by activated heat treatment. In this instance, as illustrated in FIG. 10, the widths of the first and second boundary regions 32b and 34b may gradually decrease towards the front surface of the semiconductor substrate 10. Accordingly, the width of the barrier regions 36 may gradually increase towards the front surface of the semiconductor substrate 10. In addition, junction depths (or doping depths) of the first and second boundary regions 32b and 34b may decrease in going away from the first and second main regions 32a and 34a.

When the junction depth of the first main region 32a (e.g., an average junction depth of the first main regions 32a) is denoted as a first depth, the first boundary regions 32b refers to regions in which a junction depth varies from the first depth to approximately 0. For example, the junction depth of the first boundary regions 32b may gradually decrease away from the first main regions 32a. In this regard, the junction depth of the first boundary regions 32a may vary, for example, linearly (i.e., a constant slope). However, the embodiment of the invention is not limited to the above examples and the junction depth of the first boundary regions 32a may be variously changed (e.g., non-linearly).

In this regard, starting and end points of the first boundary regions 32b may be based on portions determined to have a junction depth that varies with reference to a doping profile or the like. For example, a first point directing from the first main region 32a to the outside and having a junction depth that is smaller by 10% or more than the first depth may be denoted as the starting point of the first boundary regions 32b, and a first point directing from the first main region 32a to the outside and having a junction depth of approximately 0 may be denoted as the end point of the first boundary regions 32b. However, the embodiment of the invention is not limited to the above examples, and basis for determination of the first boundary regions 32b may be variously changed.

In addition, when the junction depth of the second main region 34a (e.g., an average junction depth of the second main regions 34a) is denoted as a second depth, the second boundary regions 34b refers to regions in which a junction depth varies from the second depth to approximately 0. For example, the junction depth of the second boundary regions 34b may gradually decrease away from the second main region 34a. In this regard, the junction depth of the second boundary regions 34a may vary, for example, linearly (i.e., a constant slope). However, the embodiment of the invention is not limited to the above examples, and the junction depth of the second boundary regions 34a may be variously changed (e.g., non-linearly).

In this regard, starting and end points of the second boundary regions 34b may be based on portions determined to have a junction depth that varies with reference to a doping profile or the like. For example, a first point directing from the second main region 34a to the outside and having a junction depth that is smaller by 10% or more than the second depth may be denoted as the starting point of the second boundary regions 34b, and a first point directing from the second main region 34a to the outside and having a junction depth of approximately 0 may be denoted as the end point of the second boundary regions 34b. However, the embodiment of the invention is not limited to the above examples, and basis for determination of the second boundary regions 34b may be variously changed.

In this instance, the widths of the first and second boundary regions 32b and 34b may be compared at the corresponding position. That is, when the widths of the first and second boundary regions 32b and 34b are compared at the same position in a thickness direction, the first boundary regions 32b may have a larger width than the second boundary regions 34b. For example, the width of the first boundary regions 32b may be twice to four times the width of the second boundary regions 34b. However, the embodiment of the invention is not limited to the above examples.

In the above description, one of the doping concentration and the junction depth of each of the first and second boundary regions 32b and 34b varies. However, in another embodiment, both the doping concentration and the junction depth of each of the first and second boundary regions 32b and 34b may vary.

Particular characteristics, structures, or effects described in connection with the embodiment are included in at least one embodiment of the invention and not necessarily in all embodiments. Furthermore, the particular characteristics, structures, or effects of any specific embodiment of the invention may be combined in any suitable manner with one or more other embodiments or may be changed by those skilled in the art to which the embodiments pertain. Therefore, it is to be understood that contents associated with such combination or change fall within the spirit and scope of the embodiments of the invention.

Although the invention have been described with reference to a number of illustrative embodiments, it should be understood that numerous other modifications and applications may be devised by those skilled in the art that will fall within the intrinsic aspects of the embodiments of the invention. More particularly, various variations and modifications are possible in concrete constituent elements of the embodiments of the invention. In addition, it is to be understood that differences relevant to the variations and modifications fall within the spirit and scope of the embodiments of the invention defined in the appended claims.

What is claimed is:

1. A solar cell comprising:
a semiconductor substrate;
a tunneling layer on a surface of the semiconductor substrate; and
a first conductive type region and a second conductive type region disposed on the tunneling layer at the same side of the semiconductor substrate,
wherein at least one of the first and second conductive type regions comprises a main region and a boundary region disposed at a peripheral portion of the main region,
the boundary region has at least one of a varying doping concentration and a varying doping depth,
the first conductive type region comprises a first main region and a first boundary region disposed at a peripheral portion of the first main region, the first boundary region having at least one of a first varying doping concentration and a first varying doping depth,
the second conductive type region comprises a second main region and a second boundary region disposed at a peripheral portion of the second main region, the second boundary region having at least one of a second varying doping concentration and a second varying doping depth, and
each of the first main region and the first boundary region includes a first conductive type dopant and each of the second main region and the second boundary region includes a second conductive type dopant different from the first conductive type dopant.

2. The solar cell according to claim 1,
wherein the first boundary region has a different width than the second boundary region.

3. The solar cell according to claim 2, wherein the semiconductor substrate comprises a base region, the first conductive type region has a conductive type opposite that of the base region, the second conductive type region has the same conductive type as that of the base region, and the first boundary region has a larger width than the second boundary region.

4. The solar cell according to claim 2, wherein the first conductive type region is of a p-type, the second conductive type region is of an n-type, and the first boundary region has a larger width than the second boundary region.

5. The solar cell according to claim 3, wherein the width of the first boundary region is twice or more of a width of the second boundary region.

6. The solar cell according to claim 5, wherein the width of the first boundary region is twice to four times the width of the second boundary region.

7. The solar cell according to claim 3, wherein the first conductive type region comprises boron (B) and is of a p-type, and the second conductive type region comprises phosphorus (P) and is of an n-type.

8. The solar cell according to claim 1, wherein at least one of the doping concentration and the doping depth of the boundary region gradually decreases in going away from the main region.

9. The solar cell according to claim 1, further comprising a barrier region or a base region disposed between the first and second conductive type regions.

10. The solar cell according to claim 1, wherein the first conductive type region, the second conductive type region and the boundary region are coplanar.

11. The solar cell according to claim 1, wherein a distance between the first and second conductive type regions is 1 μm to 100 μm.

12. A method of manufacturing a solar cell, the method comprising:
  forming a tunneling layer on a surface of a semiconductor substrate; and
  forming first and second conductive type regions on the tunneling layer at the same side of the semiconductor substrate,
  wherein at least one of the first and second conductive type regions comprises a main region and a boundary region disposed at a peripheral portion of the main region,
  the boundary region has at least one of a varying doping concentration and a varying doping depth,
  the first conductive type region comprises a first main region and a first boundary region disposed at a peripheral portion of the first main region, the first boundary region having at least one of a first varying doping concentration and a first varying doping depth,
  the second conductive type region comprises a second main region and a second boundary region disposed at a peripheral portion of the second main region, the second boundary region having at least one of a second varying doping concentration and a second varying doping depth, and
  each of the first main region and the first boundary region includes a first conductive type dopant and main region and the second boundary region includes a second conductive type dopant different from the first conductive type dopant.

13. The method according to claim 12,
  wherein the first boundary region has a different width than the second boundary region.

14. The method according to claim 13, wherein the first and second main regions are formed by ion implantation, and the first and second boundary regions are formed through diffusion by activated heat treatment of the first and second boundary regions.

15. The method according to claim 14, wherein the activated heat treatment of the first main region and the activated heat treatment of the second main region are performed together using the same manufacturing process.

16. The method according to claim 14, wherein the first and second main regions are respectively formed through ion implantation of first and second conductive type impurities using a mask member or a barrier member as a mask.

17. The method according to claim 13, wherein the forming of the first and second conductive type regions comprises:
  forming a semiconductor layer at a surface of the semiconductor substrate;
  forming the first main region by doping the semiconductor layer with a first conductive type impurity using a mask having a first opening exposing a region corresponding to the first main region;
  forming the second main region by doping the semiconductor layer with a second conductive type impurity using a mask having a second opening exposing a region corresponding to the second main region; and
  forming the first and second boundary regions in an undoped region disposed between the first and second main regions by heat-treating the first and second main regions.

18. The method according to claim 17, wherein a barrier region is disposed between the first and second conductive type regions, and
  wherein the barrier region has a smaller area than the undoped region.

19. The method according to claim 17, further comprising, between the forming of the semiconductor layer and the forming of the first main region, forming a barrier member on the semiconductor layer, the barrier member corresponding to a boundary portion between the first and second conductive type regions.

20. The method according to claim 17, further comprising, between the forming of the semiconductor layer and the forming of the first main region, forming an amorphous region in the semiconductor layer by ion-implanting a preamorphized element into a boundary portion between the first and second conductive type regions of the semiconductor layer.

* * * * *